US011239344B2

(12) United States Patent
Yu et al.

(10) Patent No.: US 11,239,344 B2
(45) Date of Patent: Feb. 1, 2022

(54) SEMICONDUCTOR DEVICES AND METHODS OF MANUFACTURING THE SAME

(71) Applicant: SAMSUNG ELECTRONICS CO., LTD., Suwon-si (KR)

(72) Inventors: Hyun Kwan Yu, Suwon-si (KR); Seung Hun Lee, Suwon-si (KR); Yang Xu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 44 days.

(21) Appl. No.: 16/686,378

(22) Filed: Nov. 18, 2019

(65) Prior Publication Data
US 2020/0328290 A1    Oct. 15, 2020

(30) Foreign Application Priority Data

Apr. 12, 2019 (KR) .......................... 10-2019-0042933

(51) Int. Cl.
*H01L 29/66* (2006.01)
*H01L 29/165* (2006.01)
*H01L 29/201* (2006.01)
*H01L 29/20* (2006.01)

(52) U.S. Cl.
CPC ...... *H01L 29/66795* (2013.01); *H01L 29/165* (2013.01); *H01L 29/201* (2013.01); *H01L 29/2003* (2013.01); *H01L 29/66636* (2013.01)

(58) Field of Classification Search
CPC ... H01L 29/66545; H01L 21/823418–823864; H01L 29/66636; H01L 21/823431
See application file for complete search history.

(56) References Cited

U.S. PATENT DOCUMENTS

| 8,609,497 | B2 |   | 12/2013 | Chung et al. |
| 9,590,103 | B2 | * | 3/2017 | Kim ..................... H01L 29/7848 |
| 9,601,600 | B2 |   | 3/2017 | Hung et al. |
| 9,646,889 | B1 | * | 5/2017 | Yu ....................... H01L 29/7848 |
| 9,748,389 | B1 |   | 8/2017 | Lee et al. |
| 9,881,838 | B2 |   | 1/2018 | Kim et al. |
| 10,026,809 | B1 |   | 7/2018 | Seong et al. |
| 10,037,915 | B1 | * | 7/2018 | Hsu ................. H01L 21/823437 |
| 10,134,859 | B1 | * | 11/2018 | Bi ....................... H01L 29/6656 |
| 2011/0201164 | A1 |   | 8/2011 | Chung et al. |

(Continued)

*Primary Examiner* — Bilkis Jahan
*Assistant Examiner* — Victor V Barzykin
(74) *Attorney, Agent, or Firm* — F. Chau & Associates, LLC

(57) ABSTRACT

A method of manufacturing a semiconductor device, the method including: forming, in a first region of a substrate, an active fin and a sacrificial gate structure intersecting the active fin; forming a first spacer and a second spacer on the substrate to cover the sacrificial gate structure; forming a mask in a second region of the substrate to expose the first region of the substrate; removing the second spacer from the first spacer in the first region of the substrate by using the mask; forming recesses at opposite sides of the sacrificial gate structure by removing portions of the active fin; forming a source and a drain in the recesses; and forming an etch-stop layer to cover both sidewalls of the sacrificial gate structure and a top surfaces of the source and drain.

20 Claims, 24 Drawing Sheets

(56) References Cited

U.S. PATENT DOCUMENTS

| | | | | |
|---|---|---|---|---|
| 2014/0369115 A1* | 12/2014 | Kim | ...................... | H01L 29/518 |
| | | | | 365/182 |
| 2016/0190280 A1* | 6/2016 | Young | ................. | H01L 29/6656 |
| | | | | 257/288 |
| 2016/0343858 A1* | 11/2016 | Kim | ................ | H01L 21/823468 |
| 2017/0200718 A1* | 7/2017 | Choi | ..................... | H01L 29/785 |
| 2018/0108660 A1* | 4/2018 | Pranatharthiharan | ........................ | |
| | | | | H01L 29/785 |

\* cited by examiner

SEMICONDUCTOR DEVICES AND METHODS OF MANUFACTURING THE SAME

CROSS-REFERENCE TO RELATED APPLICATION(S)

This application claims priority under 35 U.S.C. § 119 to Korean Patent Application No. 10-2019-0042933 filed on Apr. 12, 2019 in the Korean Intellectual Property Office, the disclosure of which is incorporated by reference herein in its entirety.

TECHNICAL FIELD

The present inventive concept relates to semiconductor devices and methods of manufacturing the same.

DISCUSSION OF THE RELATED ART

As semiconductor devices have become further developed, they have been rapidly scaled down. In addition, since it is desired for semiconductor devices to have high operating speed and accuracy in operation, various techniques are being developed to optimize a structure of transistors included in a semiconductor device. For example, a multi-gate transistor has been proposed as a way of increasing the density of an integrated circuit device. Typically, the multi-gate transistor has a three-dimensional channel in which an active fin is formed on a substrate, and a gate is formed on the active fin.

SUMMARY

According to an exemplary embodiment of the present inventive concept, a method of manufacturing a semiconductor device, the method including: forming, in a first region of a substrate, an active fin and a sacrificial gate structure intersecting the active fin; forming a first spacer and a second spacer on the substrate to cover the sacrificial gate structure; forming a mask in a second region of the substrate to expose the first region of the substrate; removing the second spacer from the first spacer in the first region of the substrate by using the mask; forming recesses at opposite sides of the sacrificial gate structure by removing portions of the active fin; forming a source and a drain in the recesses; and forming an etch-stop layer to cover both sidewalls of the sacrificial gate structure and a top surfaces of the source and drain.

According to an exemplary embodiment of the present inventive concept, a method of manufacturing a semiconductor device, the method including: forming, in a first region of a substrate, a first active fin and a first sacrificial gate structure intersecting the first active fin, and forming, in a second region of the substrate, a second active fin and a second sacrificial gate structure intersecting the second active fin; forming a first spacer and a second spacer in the first and second regions of the substrate to cover sidewalls of the first and second sacrificial gate structures; forming a first mask in the second region of the substrate to expose the first region of the substrate; removing the second spacer from the first spacer in the first region of the substrate; forming first recesses at opposite sides of the first sacrificial gate structure by removing portions of the first active fin; removing the first mask from the second region of the substrate; and forming a first source and a first drain in the first recesses.

According to an exemplary embodiment of the present inventive concept, a semiconductor device including: a substrate having a first region and a second region; first and second active fins respectively disposed in the first and second regions of the substrate, and extending in a first direction; a first gate structure disposed in the first region of the substrate, and extending in a second direction to intersect the first active fin; a second gate structure disposed in a second region of the substrate, and extending in the second direction to intersect the second active fin; a first spacer disposed on sidewalls of the first gate structure, and including a first undercut formed in an edge of a lower portion of the first spacer; a second spacer disposed on both sidewalls of the second gate structure, and including a second undercut formed in a lower portion of the second spacer; a first source and a first drain disposed in regions of the first active fin on opposite sides of the first gate structure; and a second source and a second drain disposed in regions of the first active fin on opposite sides of the second gate structure.

BRIEF DESCRIPTION OF DRAWINGS

The above and other features of the present inventive concept will become more apparent by describing in detail exemplary embodiments thereof, with reference to with the accompanying drawings, in which.

DETAILED DESCRIPTION OF THE EMBODIMENTS

Hereinafter, exemplary embodiments of the present inventive concept will be described with reference to the accompanying drawings.

Figure 1:
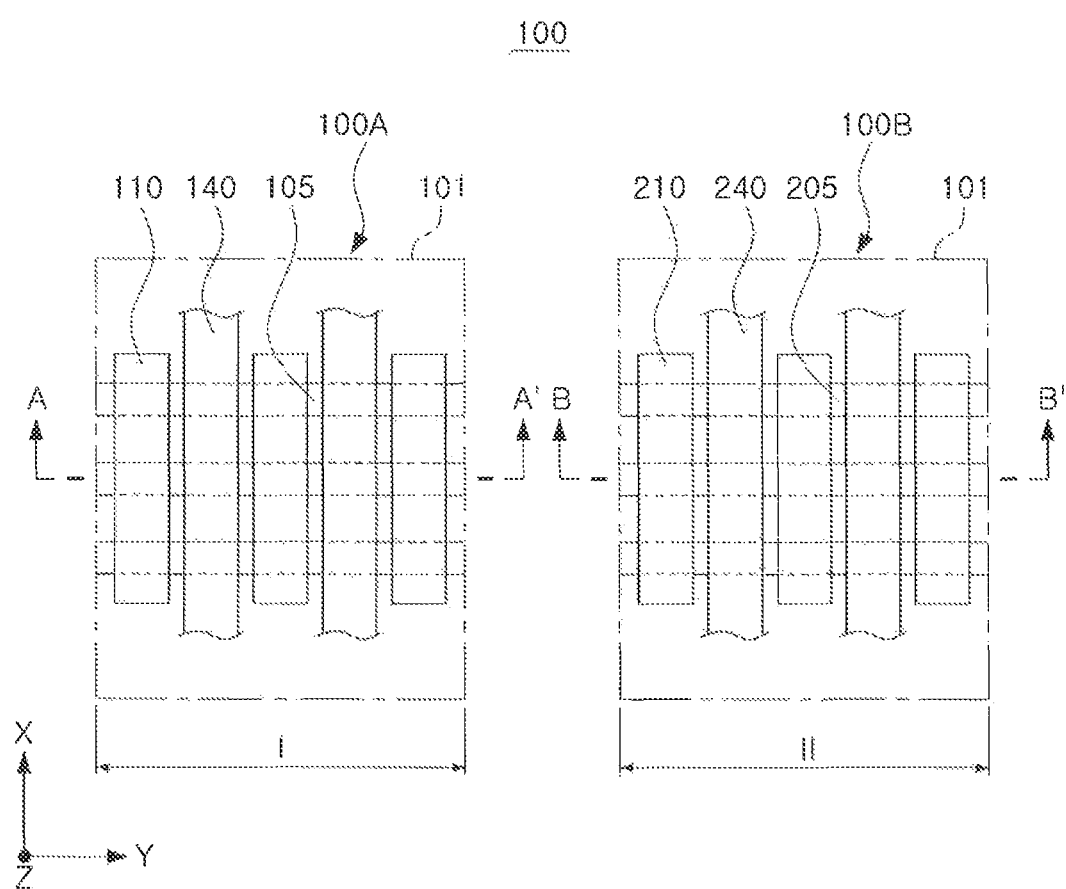
FIG. 1 is a plan view of a semiconductor device according to an exemplary embodiment of the present inventive concept.
Figure 2:
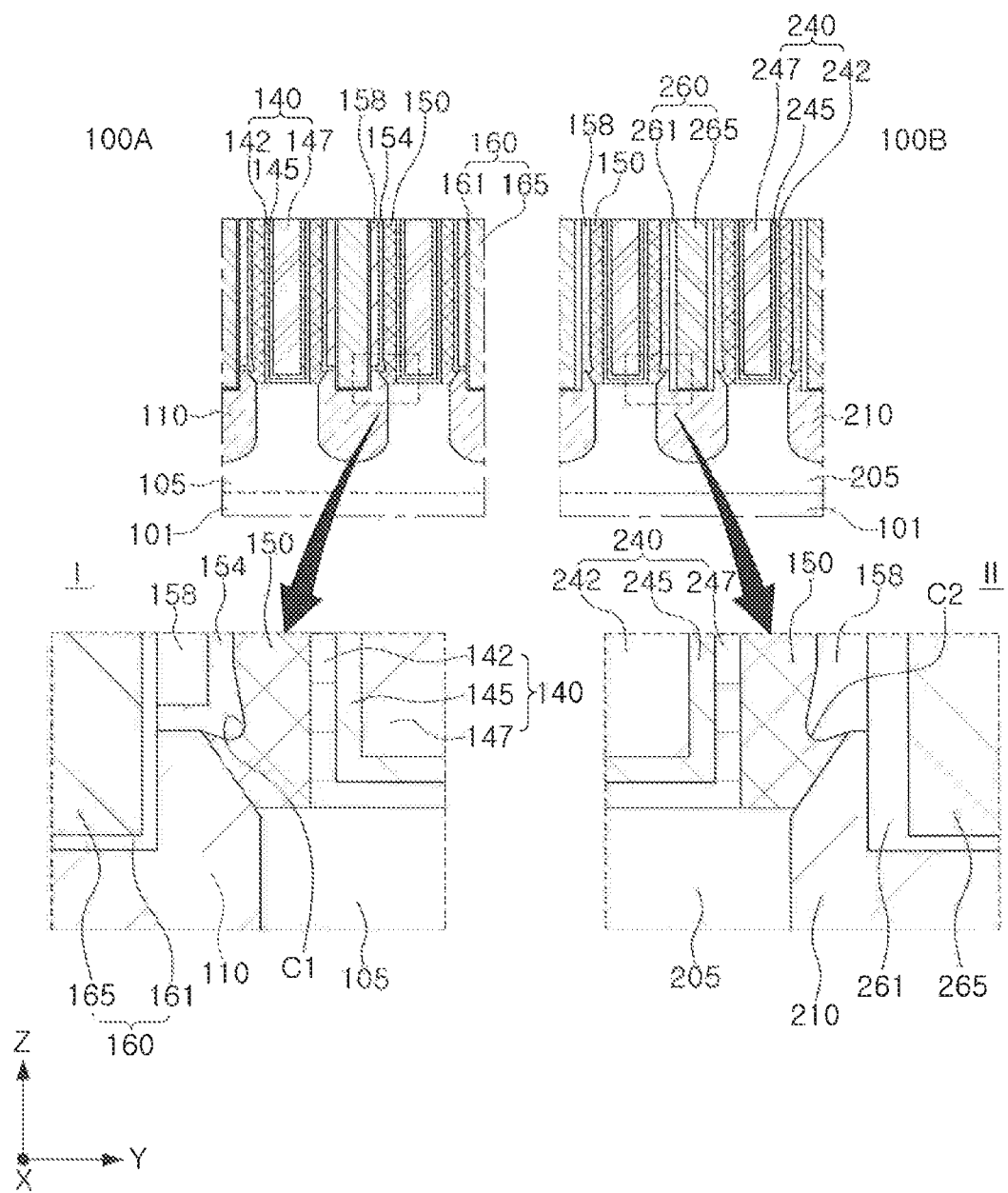
FIG. 2 is a cross-sectional view taken along lines A-A' and B-B' of FIG. 1 according to an exemplary embodiment of the present inventive concept.

FIG. 1 is a plan view of a semiconductor device according to an exemplary embodiment of the present inventive concept, and FIG. 2 is a cross-sectional view taken along lines A-A' and B-B' of FIG. 1 according to an exemplary embodiment of the present inventive concept.

Referring to FIGS. 1 and 2, a semiconductor device 100 may include a first transistor 100A, disposed in a first region I of a substrate 101, and a second transistor 100B disposed in a second region II of the substrate 101.

The substrate 101 may have a top surface extending a first direction (e.g., an X direction) and a second direction (e.g., a Y direction). The substrate 101 may include a semiconductor material, such as a Group IV semiconductor, a Group III-V compound semiconductor, or a Group II-VI compound semiconductor. For example, the substrate 101 may be a semiconductor substrate of silicon, germanium, silicon-germanium, or the like, a silicon-on-insulator (SOI) substrate, or a germanium-on-insulator (GeOI) substrate. For example, the first transistor 100A, disposed in the first region I, may be an N-type fin field effect transistor (FinFET), and the second transistor 100B, disposed in the second region II, may be a P-type fin field effect transistor (FinFET).

The first transistor 100A includes first active fins 105, first gate structures 140 intersecting the first active fins 105, and spacers 150 sequentially disposed on opposite sidewalls of the first gate structures 140. In addition, the first transistor 100A includes first sources/drains 110 disposed on opposing sides of the first active fins 105 and are adjacent to the first gate structures 140. The first transistor 100A further includes first contacts 160 disposed on opposite sides of the first gate structure 140 and connected to the first sources/drains 110. For example, the first contacts 160 may be adjacent to the first gate structure 140.

Similarly, the second transistor 100B includes second active fins 205, second gate structures 240 intersecting the second active fins 205, and spacers 150 on opposite sidewalls of the second gate structures 240. In addition, the second transistor 100B includes second sources/drains 210 disposed on opposing sides of the second active fins 205 and are adjacent to the second gate structures 240. The second transistor 100B further includes second contacts 260 disposed at the opposite sides of the second gate structures 240 and connected to the second sources/drains 210. For example, the second contacts 260 may be adjacent to the second gate structure 240.

The first and second contacts 160 and 260 may include first and second contact plugs 165 and 265, formed in a direction (e.g., a Z direction) substantially perpendicular to the top surface of the substrate 101, and first and second conductive barriers 161 and 261 disposed on surfaces of the first and second contact plugs 165 and 265, respectively. The semiconductor device 100 may further include etch-stop layers 158 respectively disposed between the first and second contacts 160 and 260 and the spacer 150. For example, the etch-stop layers 158 may be disposed between first contacts 160, and the etch-stop layers 158 may be disposed between second contacts 260.

In this embodiment, unlike the second transistor 100B, the first transistor 100A may further include a protective insulating layer 154 disposed along a surface of the spacer 150 between the spacer 150 and the etch-stop layer 158. Since the protective insulating layer 154 serves as a spacer element, a thickness of the first transistor 100A may be greater than a thickness of the second transistor 100B by an additional thickness of the protective insulating layer 154. The protective insulating layer 154 may remain without removal of the second disposable spacer introduced in a source/drain formation process (see FIGS. 4A to 4F).

The spacer 150 may be disposed on opposite sidewalls of the first and second gate structures 140 and 240. For example, the spacer 150 may be in contact with bottoms of the first and second gate structures 140 and 240 and top surfaces of the first and second active fins 105 and 205. In addition, the protective insulating layer 154 may have a shape like an "L".

As illustrated in an enlarged view of FIG. 2, the spacer 150 may be provided with first or second undercuts C1 or C2 formed on a lower end of the spacer 150 (for example, a corner portion bent at a lower end of a gate structure 140 and 240). For example, the first and second undercuts C1 and C2 may be concaved recessed portions. The first and second undercuts C1 and C2 may be formed in extending directions of the first and second gate structures 140 and 240, respectively. For example, the first and second undercuts C1 and C2 may extend in the first direction (the X direction). For example, the first and second gate structures 140 and 240 may be sacrificial gate structures 140 and 240.

In this embodiment, undercuts C1 and C2 may be formed on lower ends of the spacers 150 of both first and second transistors 100A and 100B. It will be appreciated that during removal of a disposable spacer (for example, 152 of FIG. 3B) used to form source/drain 110 and 210, lower end corners of the spacers 150 are over etched to form the undercuts C1 and C2 (see FIGS. 3B and 3C). In an example, since the first and second undercuts C1 and C2 are formed by wet etching, each of the undercuts C1 and C2 may have a slightly irregular profile depending on the extending directions thereof.

In this embodiment, the undercut C1, formed on the spacer 150 of the first transistor 100A, and the undercut C2 formed on the spacer 150 of the second transistor 100B may have different shapes (e.g., sizes and/or depths) from each other. It will be appreciated that such a difference may be caused by conditions and the number of processes of removing a disposable spacer. This will be described in detail through various examples of a manufacturing method to be described later.

Hereinafter, components of a semiconductor device according to an exemplary embodiment of the present inventive concept will be described in further detail.

The first and second active fins 105 and 205 may be disposed on the substrate 101 to extend in a first direction, for example, a Y direction. The first and second active fins 105 and 205 may have a fin structure protruding from the substrate 101. The first and second active fins 105 and 205 may be formed by etching the substrate 101. In an exemplary embodiment of the present inventive concept, the first and second active fins 105 and 205 may include an epitaxial layer grown from the substrate 101. For example, the first active fins 105 may be formed of silicon including T-type impurities, and the second active fins 205 may be formed of silicon including N-type impurities. The directions, in which the first active fins 105 and the second active fins 205 extend, are illustrated as being the same, but are not limited thereto. For example, the first active fins 105 and the second active fins 205 may extend in different directions from each other. The number of the respective first and second active fins 105 and 205 is illustrated as being three, but the present inventive concept is not limited thereto.

In an exemplary embodiment of the present inventive concept, device isolation layers may be disposed between the first active fins 105 and between the second active fins 205. The device isolation layers may be formed to have a height, such that upper portions of the first and second active fins 105 and 205 are exposed. The device isolation layers may be formed by, for example, a shallow trench isolation (STI) process. Each of the device isolation layers may be formed of an insulating material. Each of the device isolation layers may include, for example, a silicon oxide, a silicon nitride, a low-k dielectric, or combinations thereof. The low-k dielectric may include boro-phospho-silicate glass (BPSG), tonen silazene (TOSZ), undoped silicate glass (USG), spin on glass (SOG), flowable oxide (FOX), tetra-ethyl-ortho-silicate (TEOS), high density plasma CVD (HDP-CVD) oxide, or the like.

The first and second gate structures 140 and 240 may extend on the substrate 101 in a second direction, for example, an X direction and may be disposed to cross over the first and second active fins 105 and 205. Like this embodiment, the first and second gate structures 140 and 240 may intersect the first and second active fins 105 and 205, respectively. For example, the first and second gate structures 140 and 240 may be substantially perpendicular to the first and second active fins 105 and 205, respectively. A channel region may be formed in the first and second active fins 105 and 205 intersecting the first and second gate structures 140 and 240. The directions, in which the first gate structures 140 and the second gate structures 240 extend, are illustrated as being identical to each other, but the present inventive concept is not limited thereto. For example, the first gate structures 140 and the second gate structures 240 may extend in different directions from each other.

Each of the first gate structures 140 may include a first gate insulating layer 142, a first bottom gate electrode 145, and a first top gate electrode 147. The first gate insulating layer 142 may be disposed between the first active fin 105 and the first bottom gate electrode 145. The first gate insulating layer 142 may extend between the spacer 150 and the first bottom gate electrode 145. The first bottom gate electrode 145 and the first top gate electrode 147 may be sequentially disposed on the first gate insulating layer 142.

Similarly, each of the second gate structure 240 may include a second gate insulating layer 242, a second bottom gate electrode 245, and a second top gate electrode 247. The second gate insulating layer 242 may be disposed between the second active fin 205 and the second bottom gate electrode 245. The second gate insulating layer 242 may extend between the spacer 150 and the second bottom gate electrode 245. The second bottom gate electrode 245 and the second top gate electrode 247 may be sequentially disposed on the second gate insulating layer 242.

For example, each of the first and second gate insulating layers 142 and 242 may include a silicon oxide, a silicon oxynitride, a silicon nitride, or a high-k dielectric. The high-k dielectric may refer to a material having a higher dielectric constant than a silicon oxide ($SiO_2$). The high-k dielectric may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

For example, each of the first and second gate electrodes 145 and 245 may include at least one of, for example, titanium nitride (TiN), tantalum nitride (TaN), tungsten nitride (WN), titanium aluminum nitride (TiAlN), titanium aluminum (TiAl), tantalum carbide (TaC), titanium carbide (TiC), and the like. Each of the first and second top gate electrodes 147 and 247 may include a metal material such as aluminum (Al), tungsten (W), or molybdenum (Mo) or a semiconductor material such as doped polysilicon.

The spacer 150, the protective insulating layer 154, and the etch-stop layer 158 may include, for example, a silicon oxide, a silicon nitride, a silicon oxynitride, or combinations thereof. However, the spacer 150 may include a material having an etching selectivity with respect to at least the protective insulating layer 154. In an exemplary embodiment of the present inventive concept, the spacer 150 may include a material having a lower dielectric constant than at least the protective insulating layer 154. For example, the spacer 150 may include $SiO_2$ and/or a silicon oxynitride (SiON). For example, the protective insulating layer 154, used as a disposable spacer, may include a silicon nitride (SiN) and/or $Al_2O_3$. In an exemplary embodiment of the present inventive concept, a spacer and a protective insulating layer may include silicon oxynitrides having different contents of nitrogen from each other, respectively. For example, a silicon oxynitride of the protective insulating layer 154 may be configured to have a higher content of nitrogen than a content of nitrogen of a silicon oxynitride of the spacer.

The etch-stop layer 158 is a component provided to form a hole for first and second contacts 160 and 260. For example, the etch-stop layer 158 may include a silicon nitride, a silicon oxynitride, or a combination thereof. The etch-stop layer 158 may be disposed to have the same thickness in a first region I and a second region II. Although not limited thereto, in an exemplary embodiment of the present inventive concept, the etch-stop layer 158 may include a material identical or similar to a material of the protective insulating layer 154.

First sources/drains 110 may be disposed on the first active fins 105 and on opposite sides of the first gate structure 140. For example, the first sources/drains 110 may have an elevated shape in which top surfaces thereof are disposed higher than a top surface of the first active fin 105 while the first sources/drains 110 are disposed in recessed regions of the first active fins 105. For example, the first sources/drains 110 may be connected to or merged with each other on the first active fins 105. The first sources/drains 110 may be an epitaxial layer grown by a selective epitaxial process. The first source/drains 110 may include, for example, silicon heavily doped with N-type impurities or silicon-carbon (SiC). An intentionally undoped silicon layer may be further provided on uppermost portions of the first sources/drains 110.

Similarly, second sources/drains 210 may be disposed in recessed regions of the second active fins 205, and on opposite sides of the second gate structure 240. The second sources/drains 210 may be provided in a source region or a drain region of the second transistor 100B. Top surfaces of the second sources/drains 210 may be provided at substantially the same level as a bottom surface of the gate structure 240. In an exemplary embodiment of the present inventive concept, the second sources/drains 210 may have an elevated source/drain shape in which top surfaces thereof are disposed to be higher than a bottom surface of the gate structure 240. The embedded sources/drains 210 may be connected to or merged with each other on the second active fins 205. The second sources/drains 210 may be an epitaxial layer grown by a selective epitaxial process. The second sources/drains 210 may include, for example, silicon-germanium (Si—Ge) heavily doped with P-type impurities. The second sources/drains 210, including silicon-germanium, may increase mobility of holes by applying compressive stress to a channel region of the second active fin 205 including silicon (Si). The second sources/drains 210, including silicon-germanium (Si—Ge), may include a plurality of regions having different contents of germanium (Ge) from each other.

In an exemplary embodiment of the present inventive concept, an interlayer dielectric may be disposed around first and second contacts 160 and 260 on the etch-stop layer 158. For example, the interlayer dielectric may include boro-phospho-silicate glass (BPSG), tonen silazene (TOSZ), undoped silicate glass (USG), spin on glass (SOG), flowable oxide (FOX), tetra-ethyl-ortho-silicate (TEOS), high density plasma CVD (HDP-CVD) oxide, or the like.

As a semiconductor device has been miniaturized, a distance between first and second gate structures may be reduced. With the trend toward miniaturization, space for a source/drain region decreases. The present inventive concept provides various methods of protecting a spacer using a disposable spacer and selectively removing a disposable spacer to secure a space for formation of a source/drain.

Hereinafter, a method of manufacturing a semiconductor device according to an exemplary embodiment of the present inventive concept with reference to accompanying drawings will be described.

FIGS. 3A to 3D and FIGS. 4A to 4F illustrate a method of manufacturing a semiconductor device according to an exemplary embodiment of the present inventive concept and will be understood as an example of a method of manufacturing the semiconductor device illustrated in FIGS. 1 and 2.

FIGS. 3A to 3D are cross-sectional views illustrating a process of forming a source/drain 110 in a first region I according to an exemplary embodiment of the present inventive concept, and FIGS. 4A to 4F are cross-sectional views illustrating a process of forming a source/drain 210 in a second region II according to an exemplary embodiment of the present inventive concept.

Figure 3A:
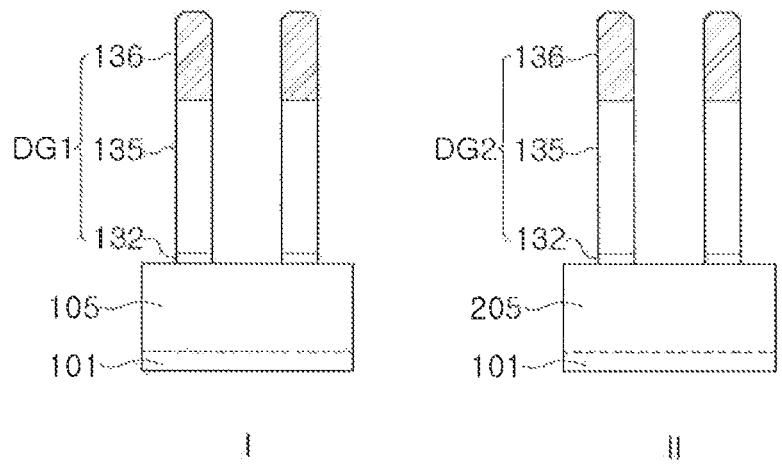
FIGS. 3A, 3B, 3C, 3D and 3E are cross-sectional views illustrating a process of forming a source/drain in a first region in a method of manufacturing a semiconductor device according to an exemplary embodiment of the present inventive concept.

Referring to FIG. 3A, a first active fin 105 and a first sacrificial gate structure DG1, intersecting the first active fin 105, are formed in a first region I of a substrate 101, and a second active fin 205 and a second sacrificial gate structure DG2, intersecting the second active fin 205, are formed in a second region II of the substrate 101.

Mask patterns may be formed on the substrate 101. The substrate 101 may be etched using the mask patterns as etching masks to form the first active fin 105 in the first region I and the second active fin 205 in the second region II. Trenches may be formed between the first active fins 105 and between the second active fins 205 by the etching process, respectively. Lower portions of the trenches may be filled with an insulating material to form an isolation layer. As a result, upper portions of the first and second active fins 105 and 205 may protrude from a top surface of the isolation layer.

First and second sacrificial gate structures DG1 and DG2 are formed to cover the first and second active fins 105 and 205. Each of the first and second sacrificial gate structures DG1 and DG2 may be a structure in which a sacrificial gate insulating layer 132, a sacrificial gate 135, and a gate mask pattern 136 are stacked, and may be formed by anisotropic etching after the stacking. For example, the sacrificial gate insulating layer 132 may include a silicon oxide, and the sacrificial gates 135 may include polysilicon. The gate mask pattern 136 may be a silicon nitride.

Figure 3B:
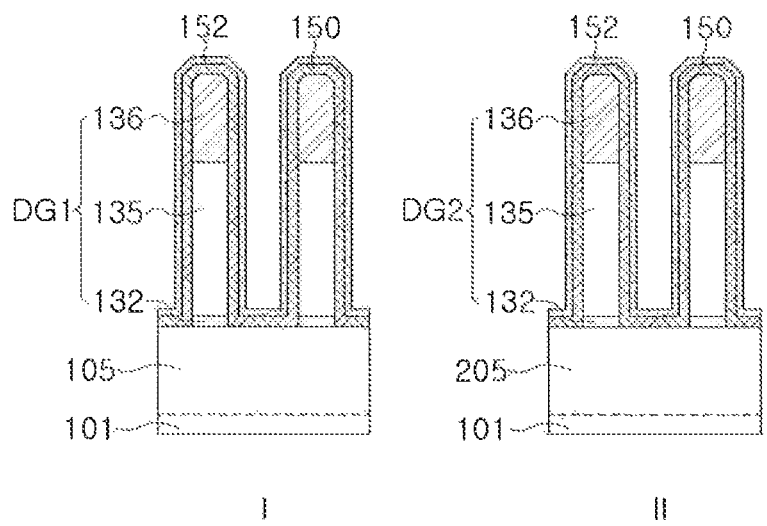

Referring to FIG. 3B, a spacer 150 and a first disposable spacer 152 may be sequentially formed in the first and second regions I and II of the substrate 101 to cover opposite sidewalls of the first and second sacrificial gate structures DG1 and DG2.

The spacer 150 may be formed of a low-k dielectric in consideration of electrical characteristics, and the first disposable spacer 152 may include a material having etching selectivity with respect to the spacer 150. In an exemplary embodiment of the present inventive concept, the first spacer 150 and the first disposable spacer 152 may include different materials from each other. For example, the spacer 150 may include $SiO_2$ and/or SiON, and the first disposable spacer 152 may include SiN and/or $Al_2O_3$. The spacer 150 and the first disposable spacer 152 may be formed by, for example, an atomic layer deposition (ALD) process.

Figure 3C:
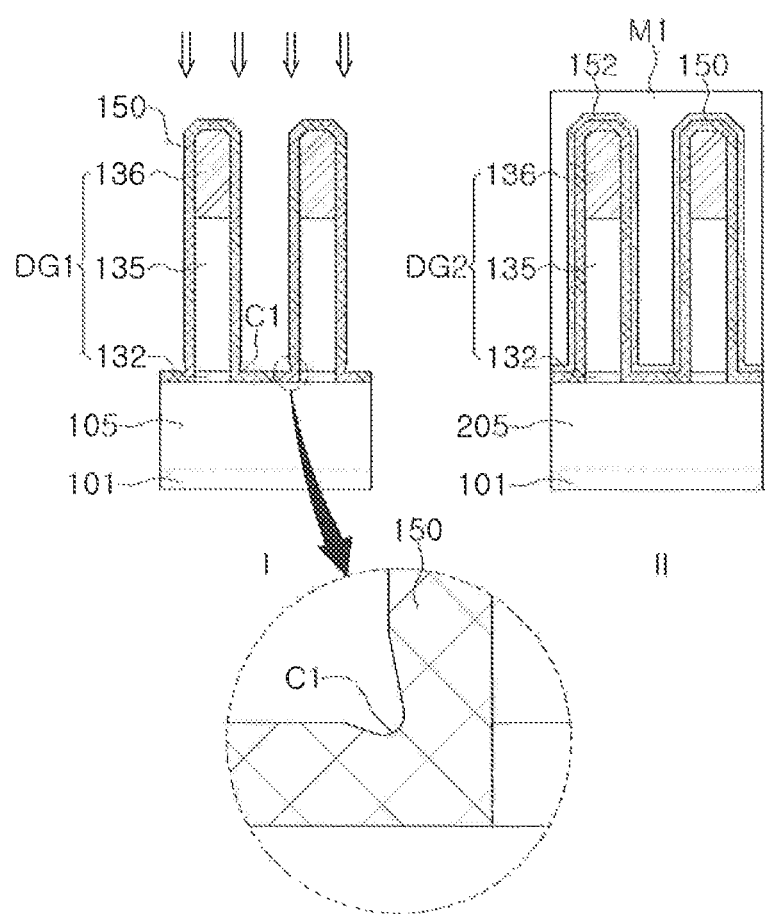

Referring to FIG. 3C, a first mask M1 is formed in the second region II to expose the first region I of the substrate 101. In the first region I of the substrate 101, the first disposable spacer 152 is removed from the spacer 150 using the first mask M1.

The first mask M1, for example, a spin-on-hard mask (SOH) may be formed to cover the second region II. In the first region I of the substrate 101, the first disposable spacer 152 may be removed from the spacer 150 using a wet etching process. As described above, the removal of the first disposable spacer 152 may be performed before a formation of a first recess to secure a source/drain forming space.

In the process of removing the first disposable spacer 152 by wet etching, an edge of a lower end of the spacer 150 may be etched due to concentration of the wet etching thereon even if an etching rate of the spacer 150 is lower. Due to the etching on the edge of the lower end of the spacer 150, a first undercut C1 may be formed in the lower end of the spacer 150 in an extending direction of the first sacrificial gate structure DG1. For example, the first undercut C1 may be formed in a region where a vertical portion of the spacer 150 meets a horizontal portion, of the spacer 150. For example, the first undercut C1 may extend toward the first sacrificial gate structure DG1. Such a first undercut C1 may be obtained by removing the first disposable spacer 152 using etching selectivity.

Figure 3D:
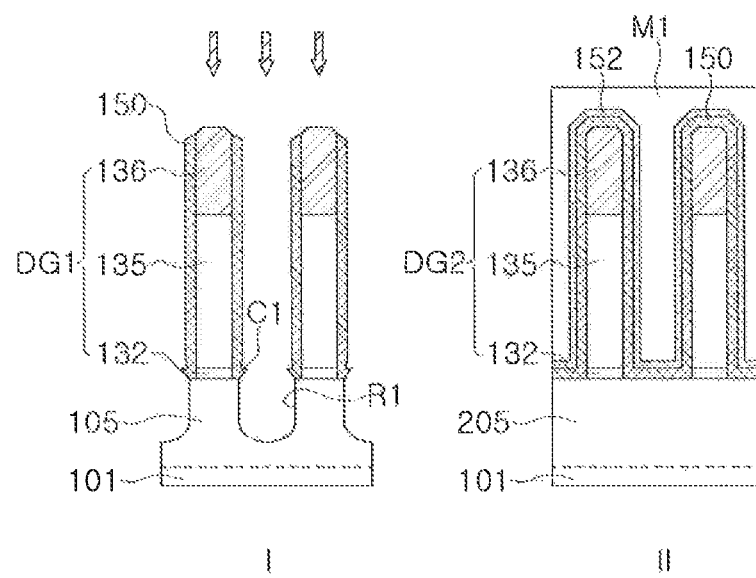

Referring to FIG. 3D, a portion of the first active fins 135 may be removed to form a first recess R1 on opposite sides, adjacent to, the first sacrificial gate structure DG1.

Anisotropic dry etching may be selectively applied to a spacer, disposed in a first region I, by using the first mask M1. In a process of the anisotropic dry etching, a portion of the spacer 150, disposed between the first sacrificial gate structures DG1 in the first region I, may be selectively removed together with a portion of the spacer 150 disposed on a top surface of the sacrificial gate structure DG1.

By using such a spacer, a first recess R1 may be formed in a portion of the first active fin 105 on opposite sides of and adjacent to the first sacrificial gate structures DG1. An isotropic etching or wet etching process may be additionally performed during formation of the first recess R1. As a result, a portion of the first recess R1 may extend to a lower side of the spacer 150, as illustrated in the drawing.

Figure 3E:
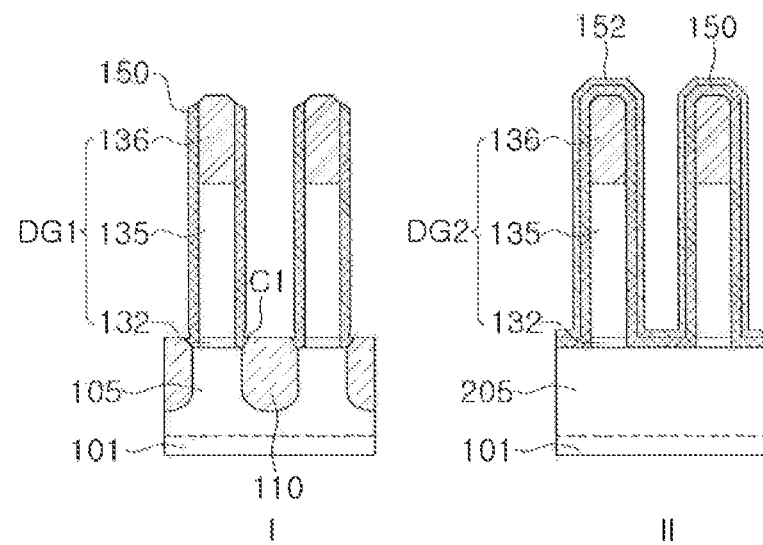

Referring to FIG. 3E, the first mask M1 may be removed, and a first source/drain 110 may be formed on opposite sides of and adjacent to the first sacrificial gate structure DG1.

After removal of the first mask M1, a precleaning process for a selective epitaxial growth (SEG) process may be performed on the first recess R1. The precleaning process may be performed by a wet cleaning process, a dry cleaning process, or a combination thereof. Insulating layer portions (for example, 136, 150, and 152) may be provided as a blocking layer allowing an epitaxial layer to be selectively grown in the first recess R1 during a subsequent epitaxial growth process.

An epitaxial layer is grown using a selective epitaxial growth process to fill the first recess R1, such that the first source/drain 110 may be formed. A top surface of the first source/drain 110 may be formed to a position higher than a top surface of the first active fin 105. However, a position of the top surface of the first source/drain 110 is not limited to that illustrated in the drawing. The first source/drain 110 may be, for example, a silicon (Si) layer. During a growth process, the first source/drain 110 may be heavily doped in-situ with an N-type impurity such as phosphorus (P). In a final step of the growth process, an undoped silicon layer may be performed on an uppermost portion of the first source/drain 110 by stopping the providing of an N-type impurity. The first sources/drains 110 may be merged with each other while growing on the first active fin 105. The first sources/drains 110 may be formed using a molecular beam epitaxy (MBE) process, a chemical vapor deposition (CVD) process, a reduced pressure chemical vapor deposition (RPCVD) process, or an ultra high vacuum chemical vapor deposition (UHV CVD) process.

Then, a source/drain forming process may be performed on the second region II of the substrate 101. The processes will be described with reference to FIGS. 4A to 4F.

Figure 4A:
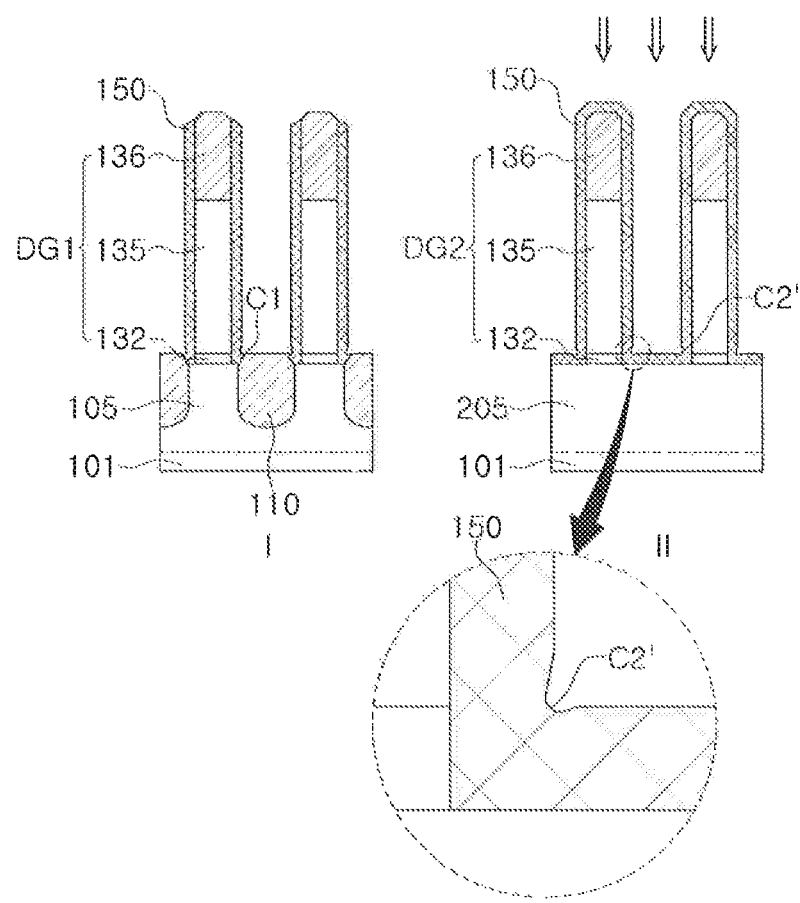
FIGS. 4A, 4B, 4C, 4D, 4E and 4F are cross-sectional views illustrating a process of forming a source/drain in a second region in a method of manufacturing a semiconductor device according to an exemplary embodiment of the present inventive concept.

Referring to FIG. 4A, the first disposable spacer 152 may be removed from the spacer 150 in the second region II of the substrate 101.

The first disposable spacer 152 may be removed from the spacer 150 in the second region II of the substrate 101 by using a wet etching process. Except for the gate mask pattern 136, the other portions are not etched in the first region I, and thus, the first disposable spacer 152 may be selectively removed in the second region II. A sufficient space for forming a source/drain may be secured through the removal of the first disposable spacer 152.

Similar to the process of FIG. 3C, in this process, wet etching may be concentrated on an edge of a lower end of the spacer 150. Thus, the edge of the lower end of the spacer 150 may be etched to form a second undercut C2' in the lower end of the spacer 150 in an extending direction of the second sacrificial gate structure DG2. For example, the second undercut C2' may be formed in a region where a vertical portion of the spacer 150 meets a horizontal portion of the spacer 150. For example, the second undercut C2' may extend toward the second sacrificial gate structure DG2.

Figure 4B:
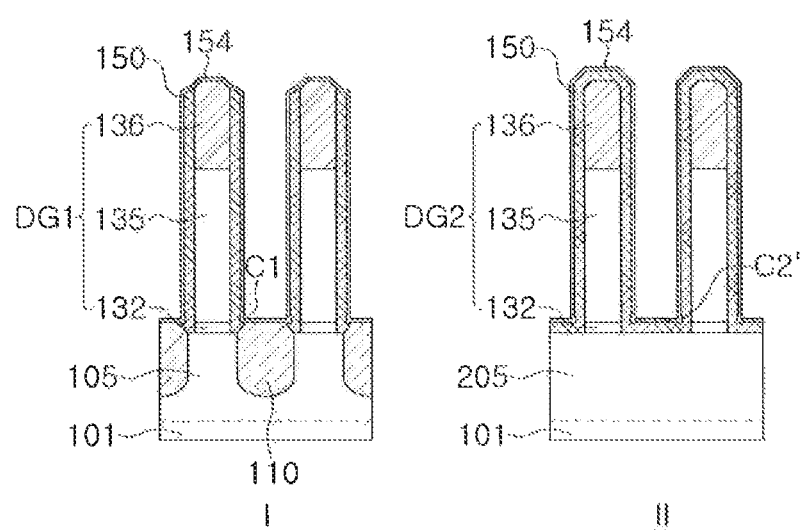

Referring to FIG. 4B, a second disposable spacer 154 may be formed on the spacer 150 in the first and second regions I and II of the substrate 101.

The second disposable spacer 154 may include a material having etching selectivity with respect to the spacer 150. For example, the second disposable spacer 154 may include SiN and/or $Al_2O_3$. In an exemplary embodiment of the present inventive concept, the second disposable spacer 154 may include the same material as the first disposable spacer 152. The second disposable spacer 154 may be formed by, for example, an atomic layer deposition (ALD) process.

Figure 4C:
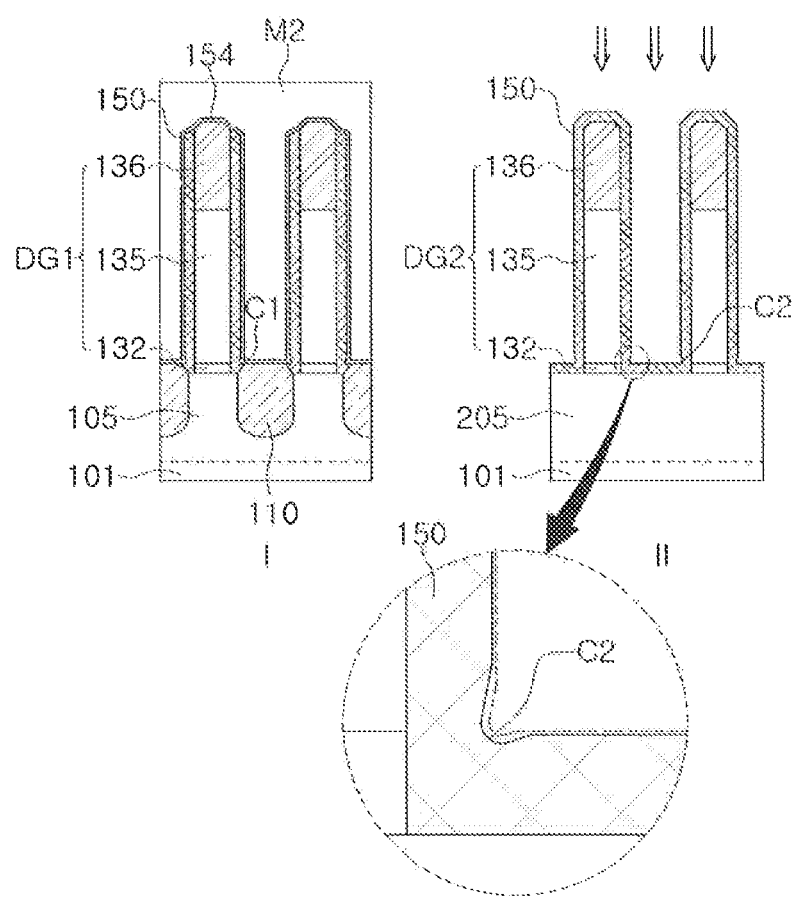

Referring to FIG. 4C, a second mask M2 may be formed in the first region I to expose the second region II of the substrate 101. The second disposable spacer 154 may be removed from the spacer 150 in the second region II by using a mask (e.g., the second mask M2).

Similar to the process illustrated in FIG. 3B, the second mask M2 may be formed to cover the first region I of the substrate 101 and the second disposable spacer 154 may be removed from the spacer 150 in the second region II of the substrate 101 by using a wet etching process. As described above, the selective removal process of the second disposable spacer 154 in the second region II may be performed before formation of the second recess to secure a source/drain forming space.

In the process of removing the second disposable spacer 154, an edge of a lower end of the spacer 150 may be etched due to concentration of wet etching thereon. The second undercut C2 may be additionally etched to extend further towards the second sacrificial gate structure DG2. In the drawing, dotted lines indicate a profile of a previous second undercut C2'. In this embodiment, etching is applied once to the edge of the lower end (e.g., a corner) of the spacer 150 in the first region I, while etching is applied twice on the edge of the lower end of the spacer 150 in the second region II. Therefore, the second undercut C2 may have a greater profile (e.g., a depth and/or a size) than the first undercut C1 under similar wet etching conditions. As described above, in the case of this embodiment, the first and second undercuts C1 and C2 may be formed to have apparently different sizes from each other.

Figure 4D:
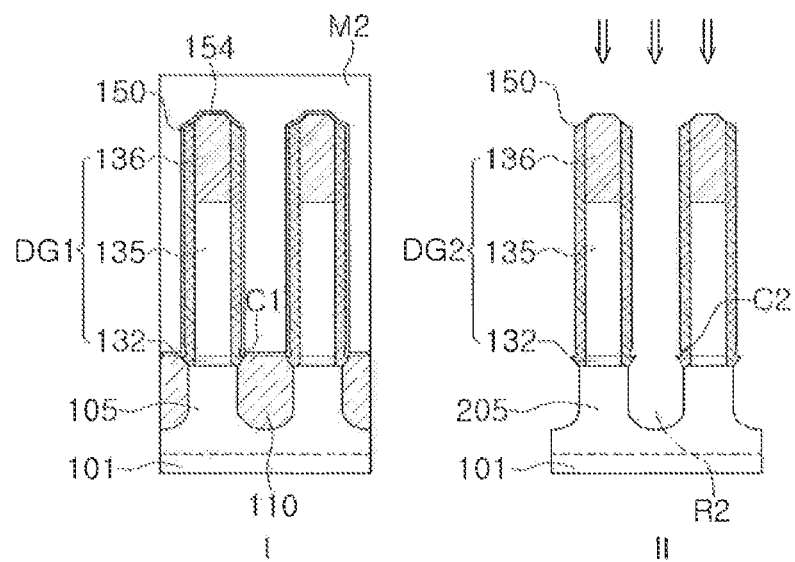

Referring to FIG. 4D, a portion of the second active fin 205 is removed to form a second recess R2 on opposite sides of and adjacent to the second sacrificial gate structure DG2.

Similar to the process of FIG. 3D, a portion of the second active fin 205 may be anisotropically dry etched using the spacer 150 to form a second recess R2 on opposite sides of and adjacent to the second sacrificial gate structures DG2. The second recess R2 may have a shape extending to a lower side of the spacer 150. To this end, an isotropic dry or wet etching process may be additionally performed.

Figure 4E:
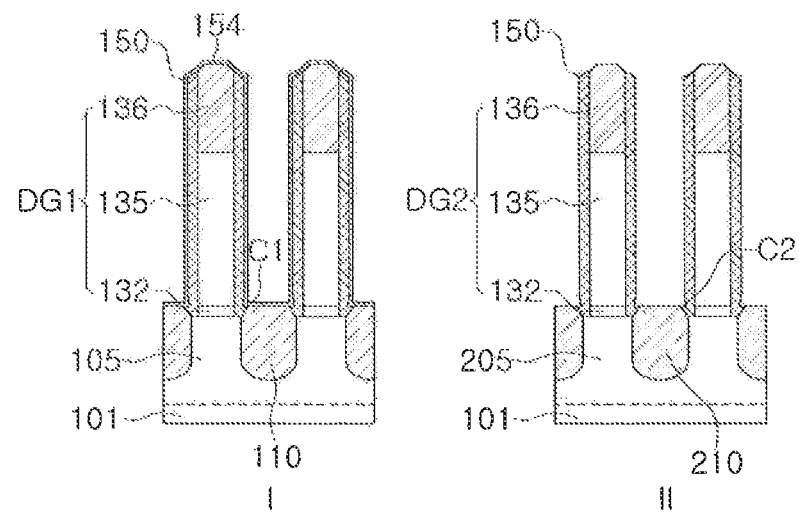

Referring to FIG. 4E, after removal of the second mask M2, a second source/drain 210 may be formed on opposite sides of and adjacent to the second sacrificial gate structures DG2.

Similar to the process of FIG. 3D, in this embodiment, an epitaxial layer may be grown to fill the second recess R2 by using a precleaning process together with a selective epitaxial growth process. Thus, a second source/drain 210 may be formed.

The second source/drain 210 may be heavily doped in-situ with P-type impurity such as boron (B) during the growth process. During the growth process, the concentration of germanium (Ge) may be controlled such that the second source/drain 210 may have a higher concentration of germanium (Ge) in an upper region than in a lower region. The second sources/drains 210 may be formed to be merged while being grown on the second active fin 205. For example, the second sources/drains 210 may be formed using a molecular beam epitaxy (MBE) process, a chemical vapor deposition (CVD) process, a reduced pressure chemical vapor deposition (RPCVD) process, or an ultra high vacuum chemical vapor deposition (UHV CVD) process.

Figure 4F:
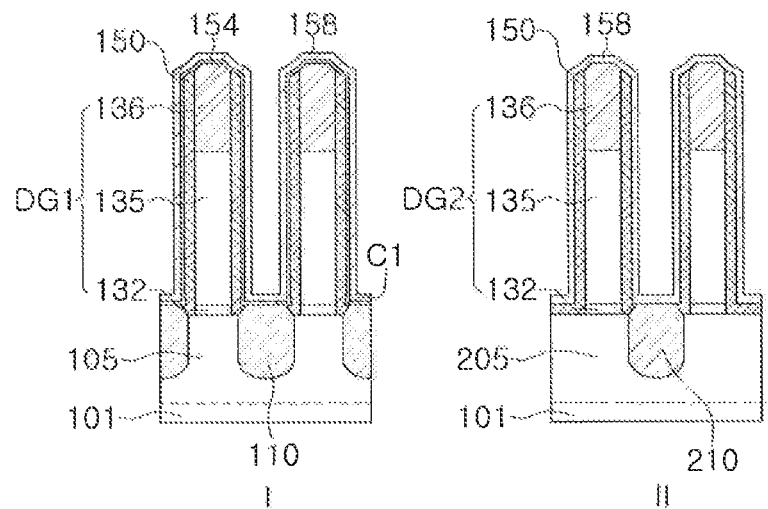

Referring to FIG. 4F, an etch-stop layer 158 may be formed to cover sidewalls of the first and second sacrificial gate structures DG1 and DG2 and top surfaces of the first source/drain 110 and the second source/drain 210.

In this embodiment, the etch-stop layer 158 may be formed with a substantially uniform thickness on a second disposable spacer (also referred to as "a protective insulating layer") 154 in the first region I and along the second sacrificial gate structure DG2, the spacer 150, and a surface of the second source/drain 210 in the second region II. For example, the etch-stop layer 158 may be formed by an atomic layer deposition (ALD) process. The etch-stop layer 158 may include a silicon nitride, a silicon oxynitride, or a combination thereof. Although not limited thereto, in an exemplary embodiment of the present inventive concept, the etch-stop layer 158 may include a material identical or similar to a material of the first and second disposable spacers 152 and 154.

In a subsequent process, the semiconductor device, illustrated in FIG. 2, may be manufactured by performing a process of forming a first contact 160 and a second contact 260, respectively connected to the first source/drain 110 and the second source/drain 210, together with a replacement process of replacing the first and second sacrificial gate structures DG1 and DG2 with the first and second gate structures 140 and 240.

In the replacement process, an interlayer dielectric is formed on the substrate 101 to cover the first and second sacrificial gate structures DG1 and DG2. The inter layer dielectric is planarized to expose top surfaces of the first and second sacrificial gate structures DG1 and DG2. The gate mask patterns 136, the sacrificial gate layer 135, and the sacrificial gate insulating layer 132 are removed to form an opening. Gate insulating layers 142 and 242, bottom gate electrodes 145 and 245, and top gate electrodes 147 and 247 are sequentially formed in the opening, and are then planarized. Thus, first and second gate structures 140 and 240 may be formed, as illustrated in FIG. 2.

Contact holes are formed to be connected to the first source/drain 110 and the second source/drain 210, respectively, by using the etch-stop layer 158. Conductive barriers 161 and 261 are formed, and the contact holes are filled with contact plugs 165 and 265. Thus, a first contact 160 and a second contact 260 are formed to be connected to the first source/drain 110 and the second source/drain 210, respectively. For example, the conductive barriers 161 and 261 may be formed of a metal nitride such as TiN, TaN, or WN. For example, the contact plugs 165 and 265 may be formed of tungsten (W), cobalt (Co), titanium (Ti), alloys thereof, or combination thereof.

In the above-described method of manufacturing a semiconductor device, both first and second disposable spacers are materials each having an etching selectivity with respect to a spacer and includes materials identical or similar to each other. However, some disposable spacers may be formed of a material similar to a material of the spacer. In addition, the second disposable spacer is not removed (see FIG. 4F) and remains even in an ultimate structure. However, the second disposable spacer may also be removed without remaining in the ultimate structure.

Such modified embodiments will be described with reference to FIGS. 5A to 5D and FIGS. 6A to 6F.

Figure 5A:
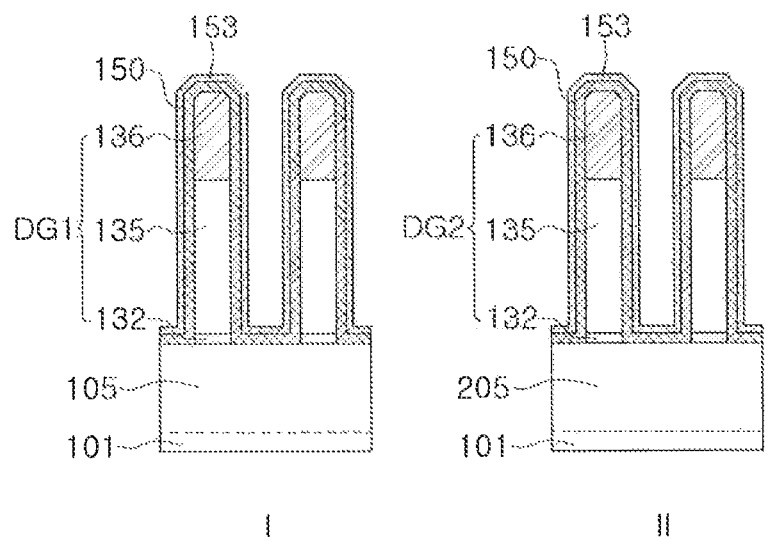
FIGS. 5A, 5B, 5C and 5D are cross-sectional views illustrating a process of forming a source/drain in a first region in a method of manufacturing a semiconductor device according to an exemplary embodiment of the present inventive concept.

Referring to FIG. 5A, a spacer 150 and a first disposable spacer 153 are sequentially formed in first and second regions I and II of a substrate 101 to cover both sidewalls of first and second sacrificial gate structures DG1 and DG2.

This process will be understood with reference to the process of FIGS. 3A and 3B. Unlike the process according to the previous embodiment, the first disposable spacer 153, employed in this embodiment, may be formed of an oxide such as SiO2 similar to a material of the spacer 150. For example, the spacer 150 may be SiON.

Figure 5B:
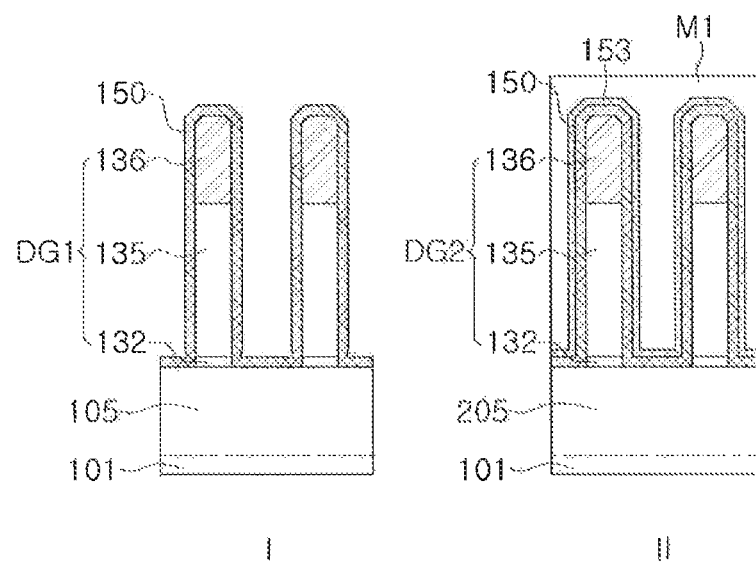

Referring to FIG. 5B, a first mask M1 may be formed in the second region II to expose the first region I of the substrate 101.

In this embodiment, the first mask M1 may be formed by forming masks in the first and second regions I and II of the substrate 101 using a material such as SOH and selectively removing a mask portion disposed in the first region I. When the mask portion disposed in the first region I is removed, it may be removed in the first region I of the substrate 101 together with the first disposable spacer 153, and the spacer 150 may be exposed. As described above, in this embodiment, a process of removing the disposable spacer 153 in the first region I may be performed without an additional etching process.

Figure 5C:
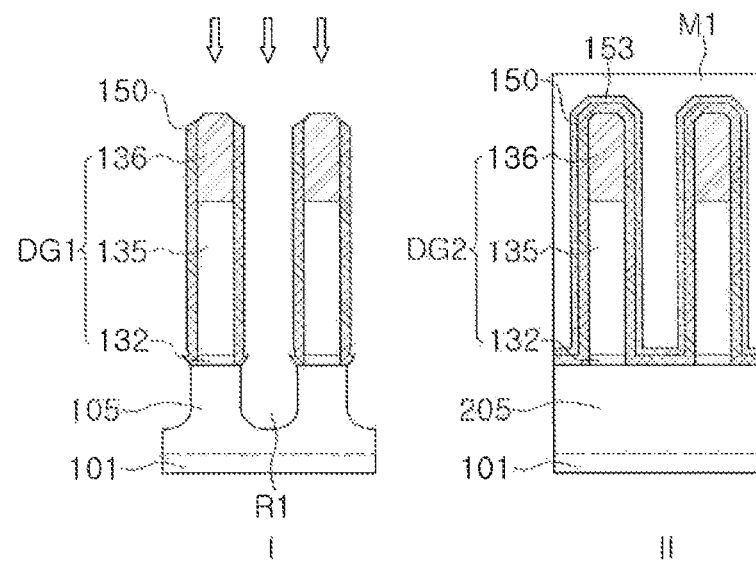

Referring to FIG. 5C, a portion of the first active fin 105 may be removed to form a first recess R1 on opposite sides of and adjacent to the first sacrificial gate structure DG1.

Similar to the process described with reference to FIG. 3D, this process may be performed by anisotropic dry etching using the spacer 150 of the first region I. In an exemplary embodiment of the present inventive concept, an isotropic dry etching or wet etching process may be additionally performed during formation of the first recess R1.

Figure 5D:
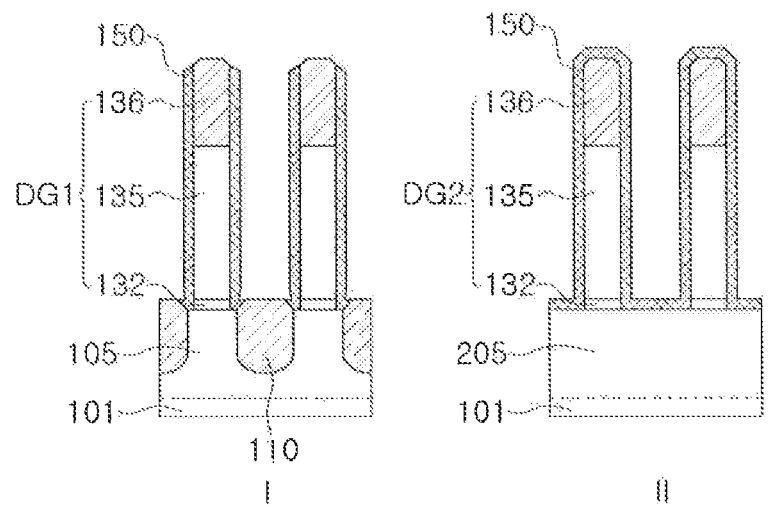

Referring to FIG. 5D, the first mask M1 may be removed, and a first source/drain 110 may be formed on opposite sides of and adjacent to the first sacrificial gate structure DG1.

Similar to the process described with reference to FIG. 3E, the process of forming the first source/drain 110 may be performed by a selective epitaxial growth process. In this embodiment, a portion of the first disposable spacer 153, disposed in the second region II, may also be removed during removal of the first mask M1.

FIGS. 6A to 6F are cross-sectional views illustrating a process of forming a source/drain in a second region in a method of manufacturing a semiconductor device according to an exemplary embodiment of the present inventive concept.

Figure 6A:
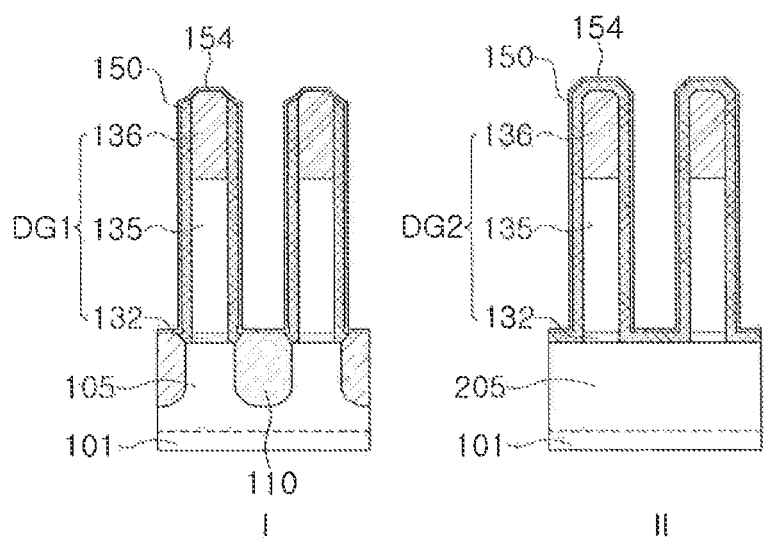
FIGS. 6A, 6B, 6C, 6D, 6E and 6F are cross-sectional views illustrating a process of forming a source/drain in a second region in a method of manufacturing a semiconductor device according to an exemplary embodiment of the present inventive concept.

Referring to FIG. 6A, a second disposable spacer 154 may be formed on the spacer 150 in the first and second regions I and II of the substrate 101.

This process may be performed similarly to the process described with reference to FIG. 4B. The second disposable spacer 154 may include a material having etching selectivity with respect to the spacer 150. For example, the second disposable spacer 154 may include SiN and/or $Al_2O_3$.

Figure 6B:
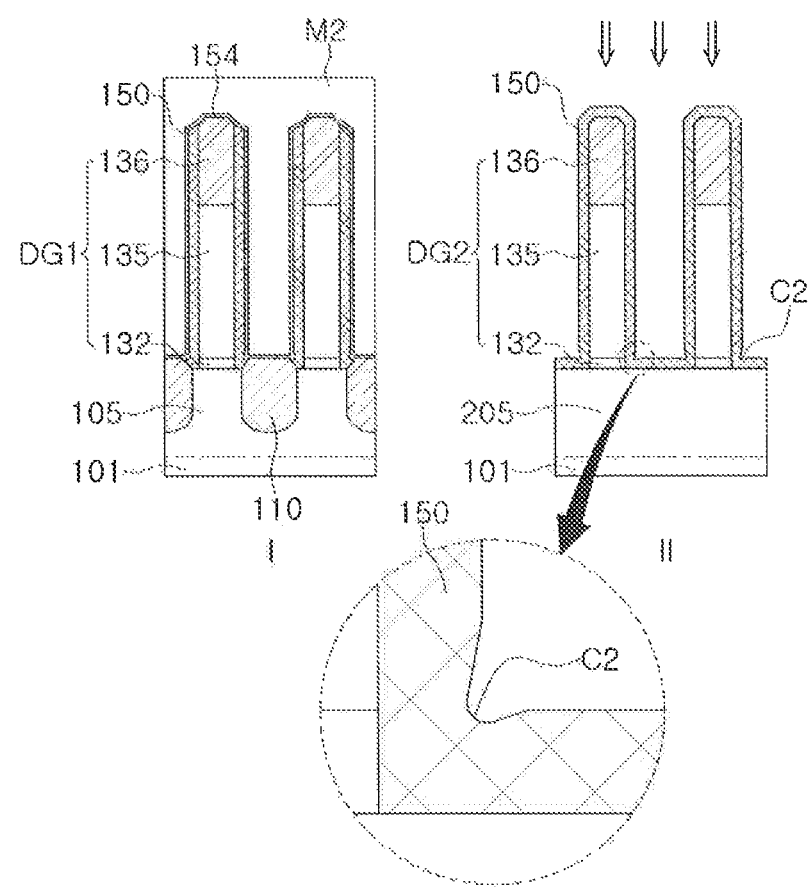

Referring to FIG. 6B, a second mask M2 may be formed in the first region I to expose the second region II of the substrate 101, and the second disposable spacer 154 may be removed from the spacer 150 in the second region II by using the second mask M2.

Similar to the process described with reference to FIG. 4C, this process may be performed by a wet etching process using the second mask M2 covering the first region I. During removal of the second disposable spacer 154, an edge of a lower end of the spacer 150 may be etched due to concentration of wet etching thereon to form a second undercut C2.

Figure 6C:
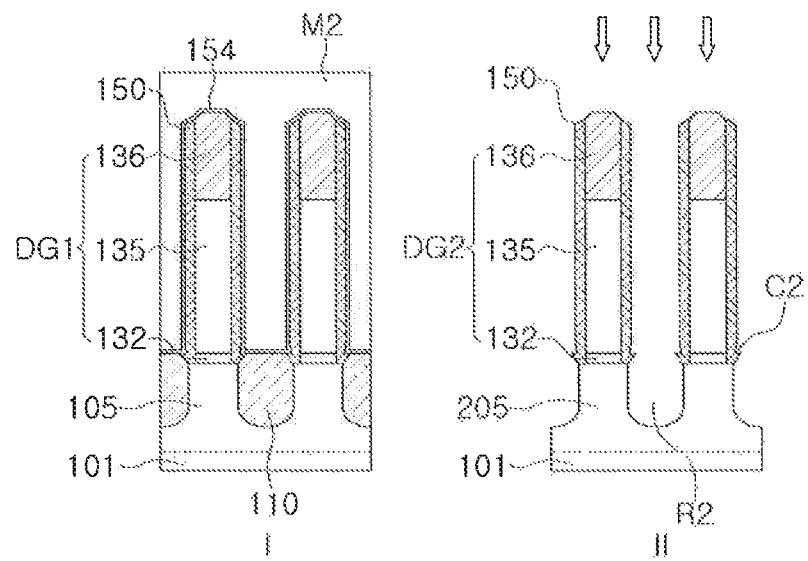

Referring to FIG. 6C, a portion of the second active fin 205 may be removed to form a second recess R2 on opposite sides of and adjacent to the second sacrificial gate structure DG2.

Similar to the process described with reference to FIG. 4D, this process may be performed by anisotropically dry-etching a portion of the second active fin 205 on opposite sides of and adjacent to the second sacrificial gate structures DG2 in the second region II by using the spacer 150. In an exemplary embodiment of the present inventive concept, an anisotropic dry or wet etching process may be additionally performed.

Figure 6D:
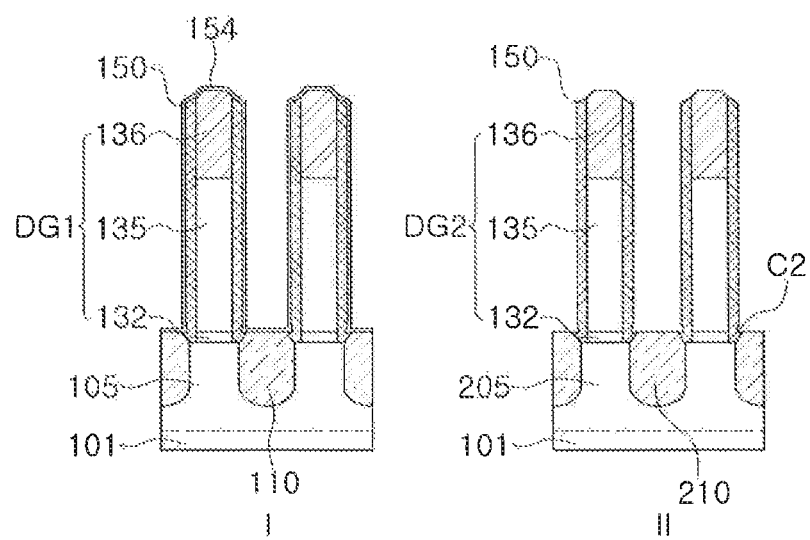

Referring to FIG. 6D, a second source/drain 210 may be formed on opposite sides of and adjacent to the second sacrificial gate structures DG2 in the second region II.

Similar to the process described with reference to FIG. 4E, this process may be performed by a selective epitaxial growth process on opposite sides of and adjacent to the second sacrificial gate structures DG2 in the second region II.

Figure 6E:
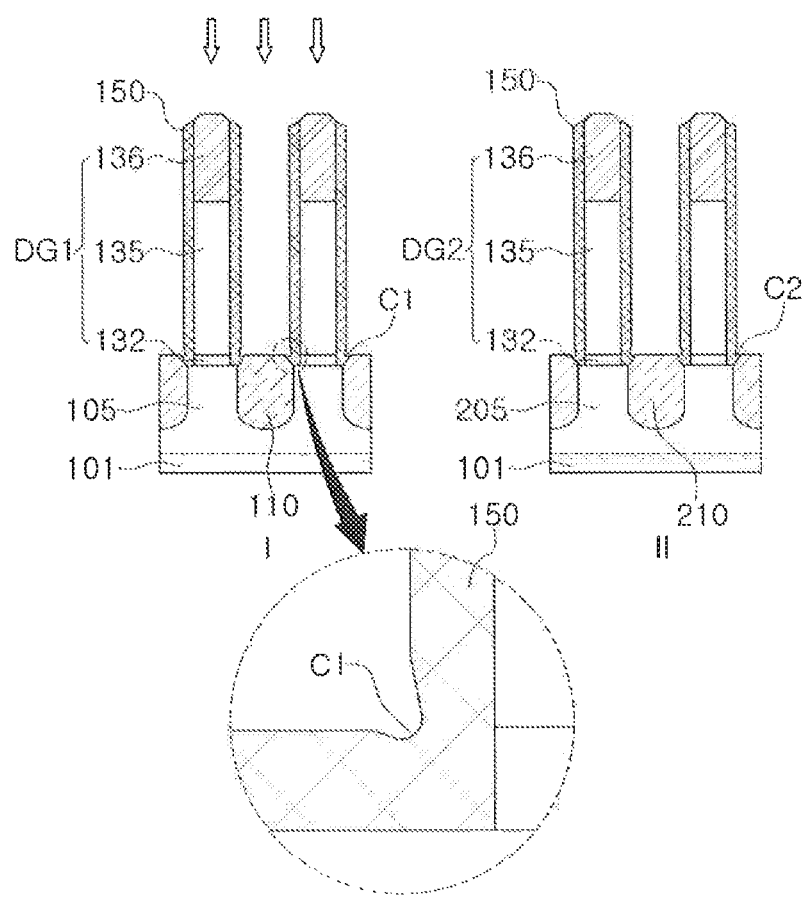

Referring to FIG. 6E, the second disposable spacer 154 may be removed from the spacer 150 in the first region I of the substrate 101.

In this embodiment, the first disposable spacer 152 may be removed from the spacer 150 in the first region I of the substrate 101 by using a wet etching process. During removal of the first disposable spacer 152, an edge of a lower end of the spacer 150 may be etched due to concentration of wet etching thereon to form a first undercut C1 in an extending direction of the first sacrificial gate structure DG1.

Figure 6F:
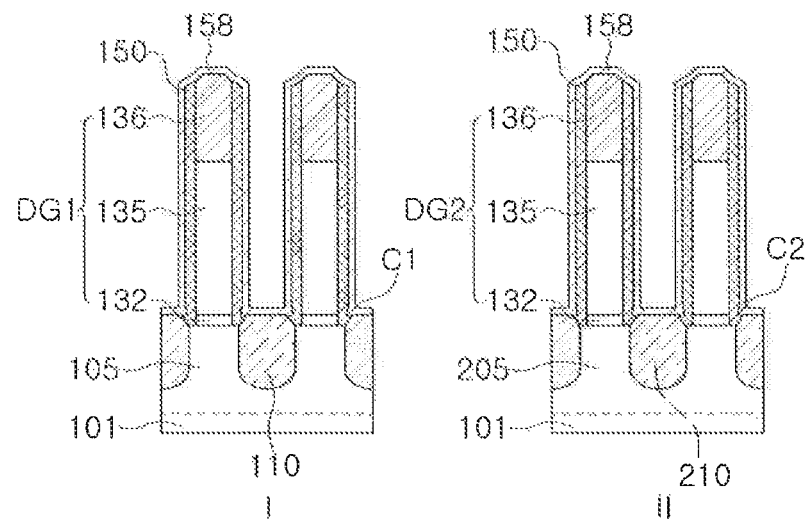

Referring to FIG. 6F, an etch-stop layer 158 may be formed to cover sidewalls of the first and second sacrificial gate structures DG1 and DG2 and top surfaces of the first source/drain 110 and the second source/drain 210.

The etch-stop layer 158 may be formed with a substantially uniform thickness on a surface of the substrate 101. For example, the etch-stop layer 158 may cover the entire surface of the substrate 101. For example, the etch-stop layer 158 may be formed by an atomic layer deposition (ALD) process. For example, the etch-stop layer 158 may include a silicon nitride, a silicon oxynitride, or a combination thereof, but a material of the etch-stop layer 158 is not limited thereto. In an exemplary embodiment of the present inventive concept, the etch-stop layer 158 may include a material identical or similar to a material of the second disposable spacer 154.

According to this embodiment, in a structure, unlike the configuration illustrated in FIG. 2, both first and second transistors may similarly have a spacer structure including the spacer 150 and the etch stop layer 158, without a protective insulating layer 154 (See FIG. 2).

Figure 7A:
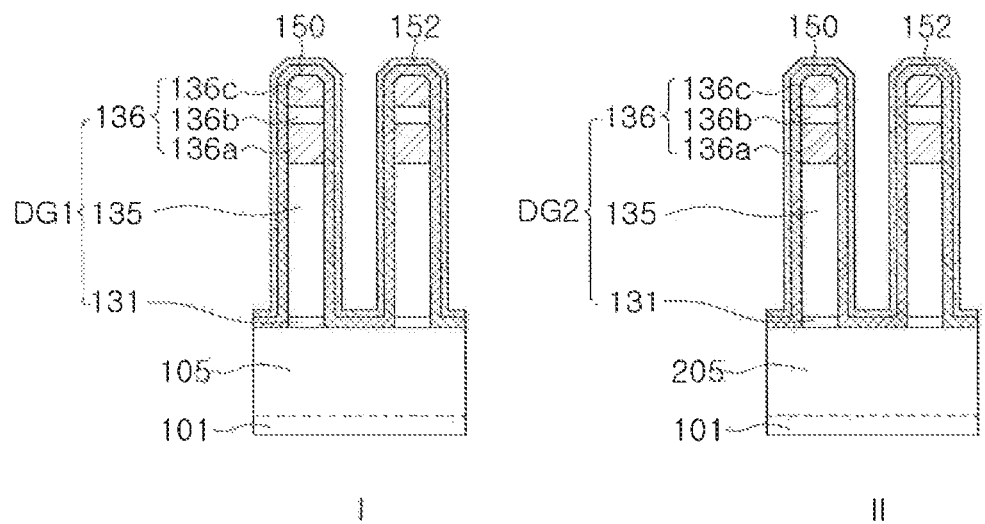
FIGS. 7A, 7B and 7C are cross-sectional views illustrating a process of forming a source/drain in a first region in a method of manufacturing a semiconductor device according to an exemplary embodiment of the present inventive concept.
Figure 7B:
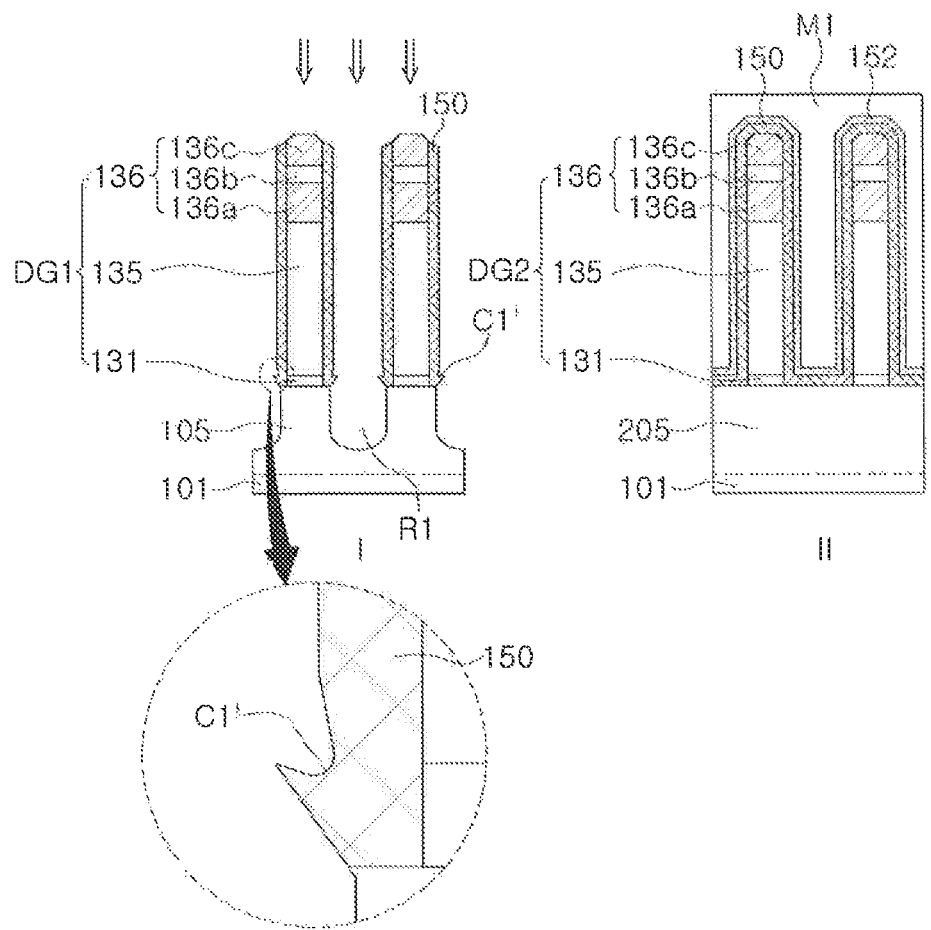
Figure 7C:
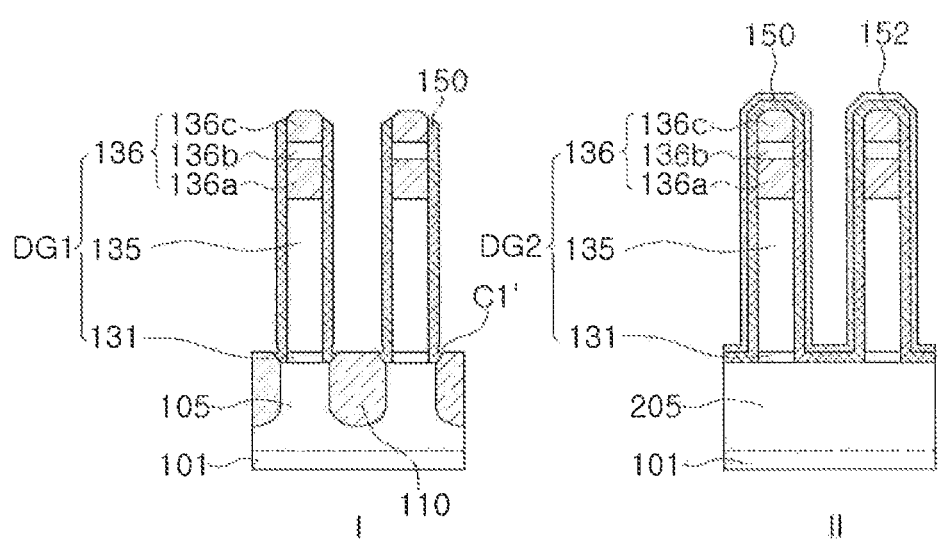

FIGS. 7A to 7C are cross-sectional views illustrating a process of forming a source/drain in a first region in a method of manufacturing a semiconductor device according to an exemplary embodiment of the present inventive concept, and FIGS. 8A to 8F are cross-sectional views illustrating a process of forming a source/drain in a second region in a method of manufacturing a semiconductor device according to an exemplary embodiment of the present inventive concept.

In this embodiment, unlike methods of manufacturing a semiconductor device according to above-described embodiments, a gate mask pattern may have a structure including a plurality of layers formed of different materials from each other. In this case, damage to first and second sacrificial gate structures may be reduced during formation of a source/drain.

Referring to FIG. 7A, a spacer 150 and a first disposable spacer 152 may be sequentially formed in first and second regions I and II of a substrate 101 to cover sidewalls of first and second sacrificial gate structures DG1 and DG2.

A gate mask pattern 136 may include two or more layers. For example, the gate mask pattern 136 may include a first layer 136a and a second layer 136b. The first layer 136a includes material having an etching selectivity with respect to the spacer 150, and the second layer 136b is disposed on the first layer 136a and includes a material having an etch selectivity with respect to the first disposable spacer 152. In the present embodiment, the gate mask pattern 136 may have a triple-layer structure and may further include a third layer 136c disposed the second layer 136b and including a material having an etching selectivity with respect to the spacer 150.

For example, in the case in which the spacer 150 may include $SiO_2$ and/or SiON and the first disposable spacer 152 may include SiN and/or $Al_2O_3$, the first and third layers 136a and 136c may include SiN and/or $Al_2O_3$ and the second layer 136b may include $SiO_2$ and/or SiON.

Referring to FIG. 7B, the first disposable spacer 152 may be removed from the spacer 150 in the first region I of the substrate 101 by using a first mask M1, and a portion of a first active fin 105 may be removed to form a first recess R1 on opposite sides of and adjacent to the first sacrificial gate structure DG1.

This process may be performed similarly to the process described with reference to FIGS. 3C and 3D. During removal of the first disposable spacer 152, a first undercut C1' may be formed on an edge of a lower end of the spacer 150 in an extending direction toward the first sacrificial gate structure DG1. A top surface of the first sacrificial gate structure DG1 may be exposed in an anisotropic etching process of forming the first recess R1.

Referring to FIG. 7C, after removal of the first mask M1 in the second region II, a first source/drain 110 may be formed on opposite sides of and adjacent to the first sacrificial gate structure DG1 in the first region I. A process of forming the first source/drain 110 may be performed by a selective epitaxial growth process, similarly to the process described with reference to FIG. 3E.

Figure 8A:
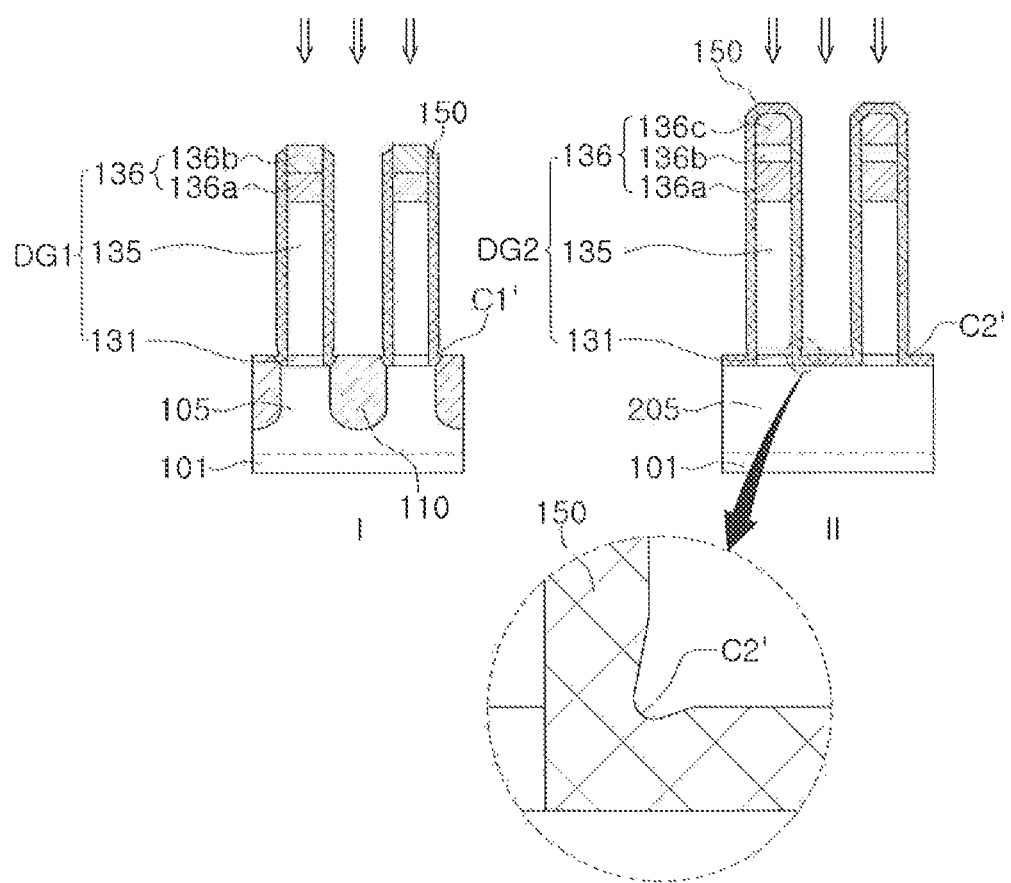
FIGS. 8A, 8B, 8C, 8D, 8E and 8F are cross-sectional views illustrating a process of forming a source/drain in a second region in a method of manufacturing a semiconductor device according to an exemplary embodiment of the present inventive concept.

Referring to FIG. 8A, the first disposable spacer 152 may be removed from the spacer 150 in the second region II of the substrate 101.

Similar to the process described with reference to FIG. 4A, this process may remove the first disposable spacer 152 in the second region II by using a wet etching process. During removal of the first disposable spacer 152, an edge of a lower end of the spacer 150 may also be etched due to a concentration of the wet etching thereon to form a second undercut C2' in the lower end of the spacer 150 in an extending direction of the second sacrificial gate structure DG2. In this process, even if the third layer 136c is removed from the first sacrificial gate structure DG1, the second layer 136b may serve as an etch-stop layer. The gate insulating pattern 136, having a multilayer structure, may reduce etching of the first sacrificial gate structure DG1.

Figure 8B:
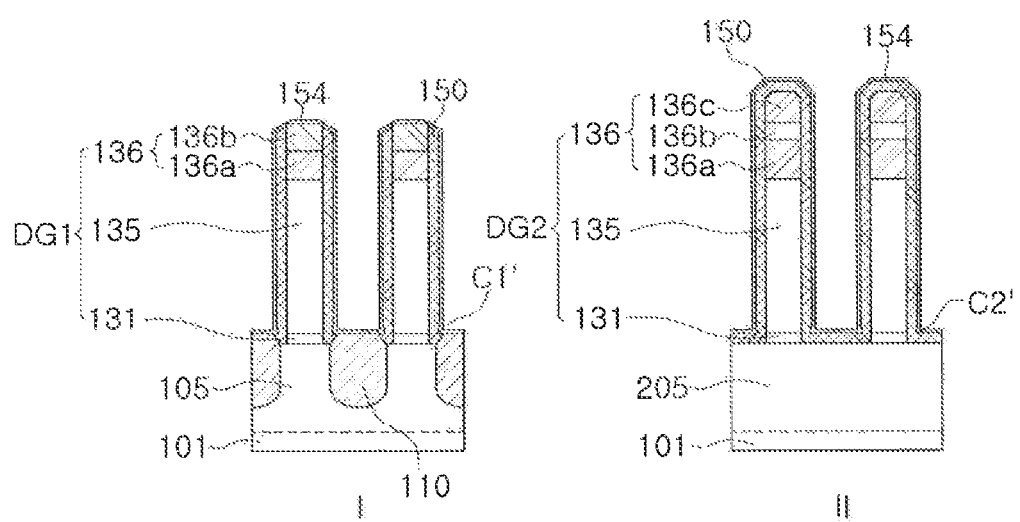

Referring to FIG. 8B, a second disposable spacer 154 may be formed on the spacer 150 in the first and second regions I and II of the substrate 101.

This process may be performed, similarly to the process described with reference to FIG. 4B. The second disposable spacer 154 may include a material having etching selectivity with respect to the spacer 150. For example, the second disposable spacer 154 may include SiN and/or $Al_2O_3$.

Figure 8C:
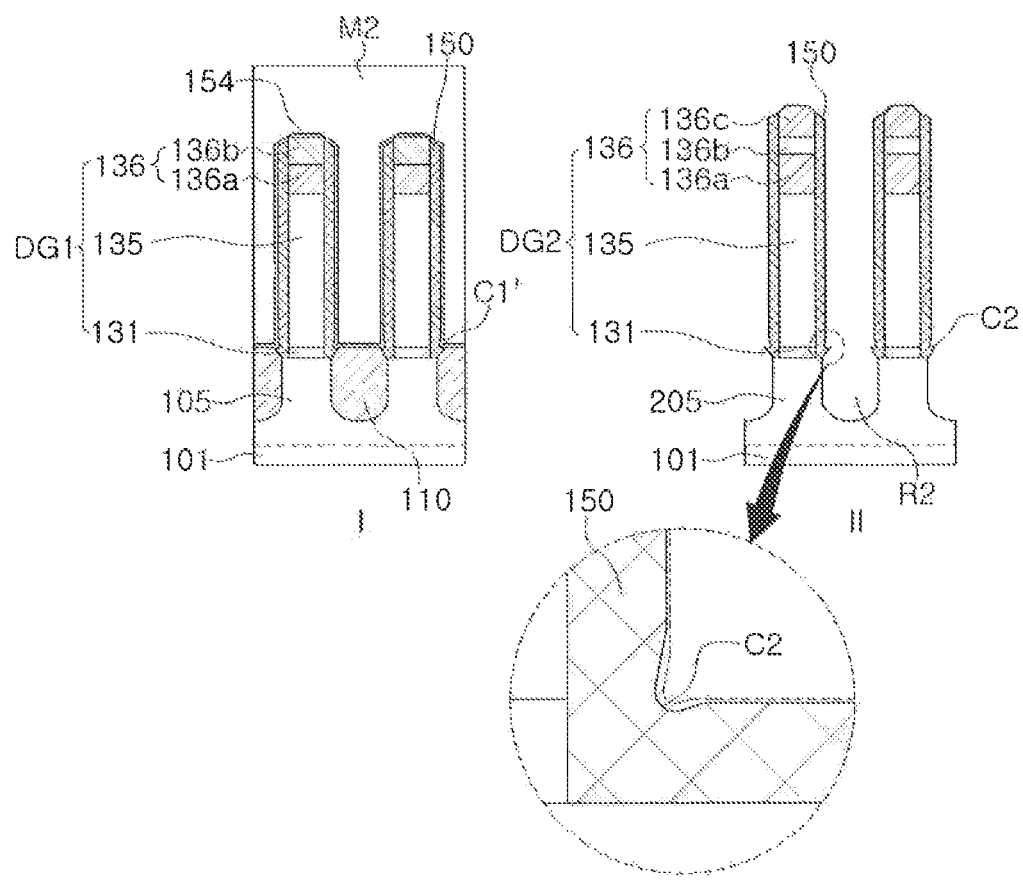

Referring to FIG. 8C, the second disposable spacer 154 may be removed from the spacer 150 in the second region II by using a second mask M2, and a second recess R2 may be formed in the second region II.

This process may be performed similarly to the process described with reference to FIGS. 4C and 4D. The second disposable spacer 154 in the second region II may be removed by a wet etching process using the second mask M2 covering the first region I. During removal of the second disposable spacer 154, wet etching may be concentrated on an edge of a lower end of the spacer 150 to form an extended second undercut C2 in the second region II. A portion of the second active fin 205 may be anisotropically dry etched using the spacer 150 on opposite sides of and adjacent to the second sacrificial gate structure DG2 in the second region II. In an exemplary embodiment of the present inventive concept, an isotropic dry or wet etching process may be additionally performed.

Figure 8D:
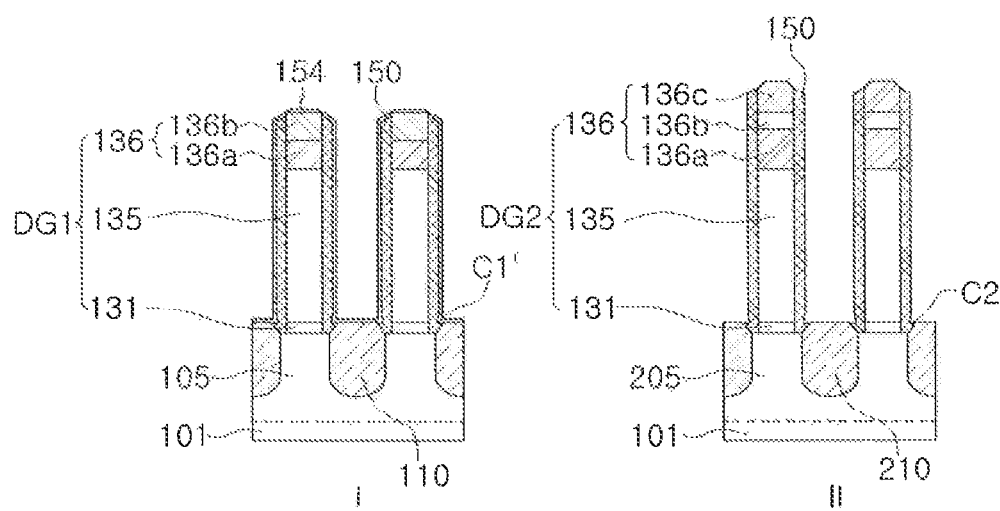

Referring to FIG. 8D, a second source/drain 210 may be formed on opposite sides of and adjacent to the second sacrificial gate structure DG2 in the second region II.

Similar to the process described with reference to FIG. 4E, this process may be performed by a selective epitaxial growth process on opposite sides of and adjacent to the second sacrificial gate structure DG2 in the second region II.

Figure 8E:
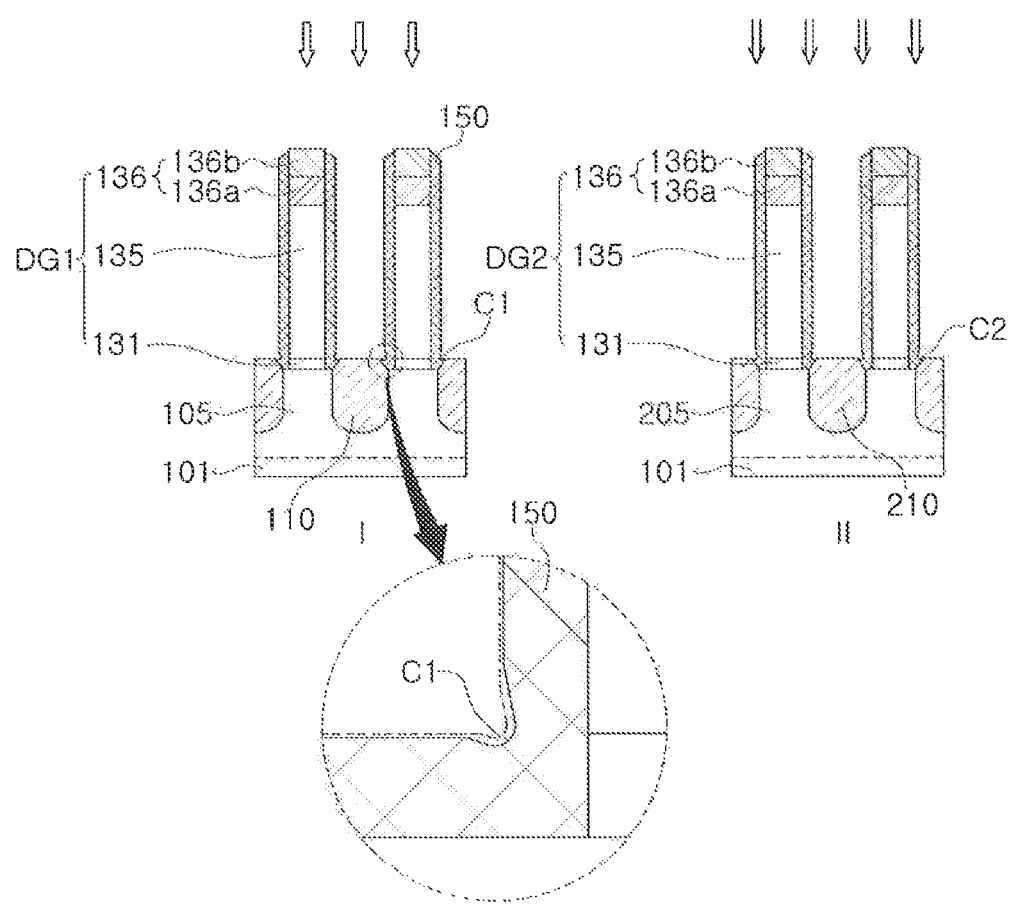

Referring to FIG. 8E, the second disposable spacer 154 may be removed from the spacer 150 in the first region I of the substrate 101. During removal of the second disposable spacer 154, wet etching may be concentrated on an edge of a lower end of the spacer 150 to form an extended undercut C1. In this process, even if a third layer 136c is removed from the second sacrificial gate structure DG2, a second layer 136b may serve as an etch-stop layer. The gate insulating pattern 136, having a multilayer structure, may reduce etching of the second sacrificial gate structure DG2.

Figure 8F:
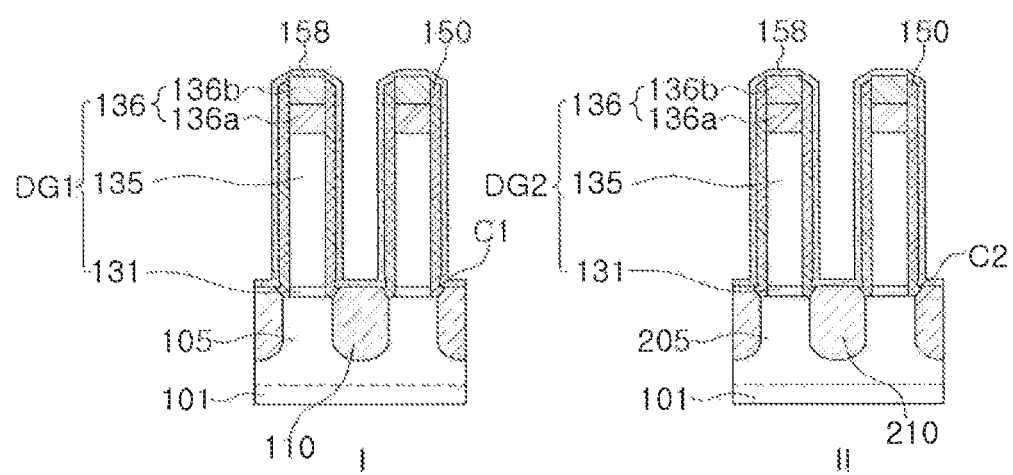

Referring to FIG. 8F, an etch-stop layer 158 may be formed on the substrate 101.

The etch-stop layer 158 may be formed with a substantially uniform thickness on a surface of the substrate 101. For example, the etch-stop layer 158 may be formed by an atomic layer deposition (ALD) process. For example, the etch-stop layer 158 may include a silicon nitride, a silicon oxynitride, or a combination thereof. Although not limited thereto, in an exemplary embodiment of the present inventive concept, the etch-stop layer 158 may include a material identical or similar to a material of the second disposable spacer 154.

According to an example embodiment of the present inventive concept, a source/drain may be stably formed in a narrow space between gate structures through a simplified process by using an external spacer layer (also referred to as "a disposable spacer") which may be selectively removed during a subsequent process. In addition, a spacer having improved electrical characteristics (for example, a low-k) may be employed by using a disposable spacer.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A method of manufacturing a semiconductor device, the method comprising:
    forming, in a first region of a substrate, an active fin and a sacrificial gate structure intersecting the active fin;
    forming a first spacer and a second spacer on the substrate to cover the sacrificial gate structure;
    forming a mask in a second region of the substrate to expose the first region of the substrate;
    removing the second spacer from the first spacer in the first region of the substrate by using the mask;
    forming recesses at opposite sides of the sacrificial gate structure by removing portions of the active fin;
    forming a source and a drain in the recesses;
    forming a third spacer on the sacrificial gate structure, the first spacer, and the source and the drain;
    forming an etch-stop layer to cover both sidewalls of the sacrificial gate structure and top surfaces of the source and drain, wherein the etch stop layer is formed directly on the source and drain after a removal of the third spacer from the sacrificial gate structure, the first spacer, the source, and the drain.

2. The method of claim 1, wherein the second spacer comprises a material having etching selectivity with respect to the first spacer.

3. The method of claim 2, wherein the removing the second spacer is performed by wet etching.

4. The method of claim 3, wherein in the removing of the second spacer, an undercut is formed in a lower end of the first spacer.

5. The method of claim 1, wherein the first spacer comprises $SiO_2$ or SiON.

6. The method of claim 5, wherein the second spacer comprises SiN or $Al_2O_3$.

7. The method of claim 1, further comprising:
    removing the mask from the second region of the substrate between the forming of the recesses and the forming of the source and drain.

8. The method of claim 7, further comprising:
    removing the second spacer from the second region of the substrate between the forming of the source and drain and the forming of the etch-stop layer.

9. The method of claim 1, wherein the sacrificial gate structure comprises a sacrificial gate layer and a gate mask pattern disposed on the sacrificial gate layer.

10. The method of claim 9, wherein the gate mask pattern comprises a first layer, comprising a material having an etch selectivity with respect to the first spacer, and a second layer disposed on the first layer, and comprising a material having an etching selectivity with respect to the second spacer.

11. A method of manufacturing a semiconductor device, the method comprising:
    forming, in a first region of a substrate, a first active fin and a first sacrificial gate structure intersecting the first active fin, and forming, in a second region of the substrate, a second active fin and a second sacrificial gate structure intersecting the second active fin;
    forming a first spacer and a second spacer in the first and second regions of the substrate to cover sidewalls of the first and second sacrificial gate structures, wherein the second spacer is formed on the first spacer before any portions of the first spacer are removed;
    forming a first mask in the second region of the substrate to expose the first region of the substrate;
    removing the second spacer from the first spacer in the first region of the substrate;
    forming first recesses at opposite sides of the first sacrificial gate structure by removing portions of the first active fin;
    removing the first mask from the second region of the substrate;
    forming a first source and a first drain in the first recesses; and
    removing the second spacer from the first spacer in the second region of the substrate after forming the first source and the first drain in the first recesses in the first region.

12. The method of claim 11, after the forming of the first source and first drain, the method further comprises:
    forming a third spacer on the first spacer in the first and second regions of the substrate;
    forming a second mask in the first region of the substrate to expose the second region of the substrate;
    removing the third spacer from the first spacer in the second region of the substrate by using the second mask;
    forming second recesses at opposite sides of the second sacrificial gate structure by removing a portion of the second active fin;

forming a second source and a second drain in the second recesses; and forming an etch-stop layer in the first and second regions to cover the sidewalls of the first and second sacrificial gate structures.

13. The method of claim 12, further comprising:

removing the third spacer from the first spacer in the first region of the substrate between the forming of the second recesses and the forming of the etch-stop layer.

14. The method of claim 13, wherein each of the first and second sacrificial gate structures comprises a sacrificial gate layer and a gate mask pattern disposed on the sacrificial gate layer, and the gate mask pattern comprises a first layer, a second layer, and a third layer sequentially stacked, and the second layer comprises a material having an etching selectivity with respect to the first and third layers.

15. The method of claim 14, wherein in the removing of the second spacer from the second region of the substrate, the third layer is removed from the first sacrificial gate structure, and the second layer serves as an etch-stop layer in the first sacrificial gate structure, and in the removing of the third spacer from the first region of the substrate, the third layer is removed from the second sacrificial gate structure and the second layer serves as an etch-stop layer in the second sacrificial gate structure.

16. The method of claim 12, wherein the first spacer comprises at least one of $SiO_2$ and SiON, and the second and third spacers comprise SiN or $Al_2O_3$.

17. A method of manufacturing a semiconductor device, the method comprising:

forming, in a first region of a substrate, a first active fin and a first sacrificial gate structure intersecting the first active fin, and forming, in a second region of the substrate, a second active fin and a second sacrificial gate structure intersecting the second active fin;

forming a first spacer and a second spacer in the first and second regions of the substrate to cover sidewalls of the first and second sacrificial gate structures;

forming a first mask in the second region of the substrate to expose the first region of the substrate;

removing the second spacer from the first spacer in the first region of the substrate;

forming first recesses at opposite sides of the first sacrificial gate structure by removing portions of the first active fin;

removing the first mask from the second region of the substrate; and forming a first source and a first drain in the first recesses, wherein the forming of the first mask comprises forming the first mask in the first and second regions of the substrate and removing a mask portion of the first mask disposed in the first region, the removing of the mask portion disposed in the first region comprises removing the second spacer in the first region of the substrate, and the removing of the first mask comprises removing the second spacer from the first spacer in the second region.

18. The method of claim 17, after the forming of the first source and first drain, the method further comprises:

forming a third spacer on the first spacer in the first and second regions of the substrate;

forming a second mask in the first region of the substrate to expose the second region of the substrate;

removing the third spacer from the first spacer in the second region of the substrate by using the second mask;

forming second recesses at opposite sides of the second sacrificial gate structure by removing portions of the second active fin;

forming a second source and a second drain in the second recess; and forming an etch-stop layer in the first and second regions to cover the sidewalls of the first and second sacrificial gate structures.

19. The method of claim 18, further comprising:

removing the third spacer from the first spacer in the first region of the substrate between the forming of the second recesses and the forming of the etch-stop layer.

20. The method of claim 18, wherein the first spacer comprises $SiO_2$ or SiON, and wherein the second spacer comprises an oxide, and the third spacer comprises SiN or $Al_2O_3$.

* * * * *